US012745536B2

(12) United States Patent
Seo et al.

(10) Patent No.: US 12,745,536 B2
(45) Date of Patent: Sep. 22, 2026

(54) LIGHT RECEIVING ELEMENT AND ELECTRONIC DEVICE INCLUDING THE SAME

(71) Applicant: Samsung Display Co., Ltd., Yongin-si (KR)

(72) Inventors: Dongkyu Seo, Yongin-si (KR); Junyong Shin, Gunpo-si (KR); Seokgyu Yoon, Hwaseong-si (KR); Daeho Lee, Seoul (KR); Byungseok Lee, Suwon-si (KR); Jin-Soo Jung, Hwaseong-si (KR); Minsoo Choi, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 637 days.

(21) Appl. No.: 17/885,856

(22) Filed: Aug. 11, 2022

(65) Prior Publication Data

US 2023/0157125 A1 May 18, 2023

(30) Foreign Application Priority Data

Nov. 18, 2021 (KR) ........................ 10-2021-0159341

(51) Int. Cl.
*H10K 59/60* (2023.01)
*H10K 50/125* (2023.01)
(Continued)

(52) U.S. Cl.
CPC ........... *H10K 59/60* (2023.02); *H10K 50/125* (2023.02); *H10K 50/15* (2023.02); *H10K 50/16* (2023.02);
(Continued)

(58) Field of Classification Search
CPC ...... H10K 59/60; H10K 50/125; H10K 50/15; H10K 50/16; H10K 50/858; H10K 59/122;
(Continued)

(56) References Cited

U.S. PATENT DOCUMENTS 9,356,076 B2 5/2016 Wang et al.
9,666,817 B2 5/2017 Kim et al.
(Continued)

FOREIGN PATENT DOCUMENTS

CN 112802965 5/2021
DE 10209789 9/2003
(Continued)

OTHER PUBLICATIONS

International Search Report for International Application No. 22204929.8-1212, dated Apr. 4, 2023.

*Primary Examiner* — Jacob Y Choi
*Assistant Examiner* — Grace Cha
(74) *Attorney, Agent, or Firm* — Lerner David LLP

(57) ABSTRACT

A light receiving element includes a first electrode, a hole transport region disposed on the first electrode, a light receiving layer disposed on the hole transport region and converting incident light to an electrical signal, an electron
(Continued)

transport region disposed on the light receiving layer, and a second electrode disposed on the electron transport region. The light receiving layer includes a p-dopant compound, a donor compound, and an acceptor compound.

21 Claims, 12 Drawing Sheets

(51) Int. Cl.
*H10K 50/15* (2023.01)
*H10K 50/16* (2023.01)
*H10K 50/858* (2023.01)
*H10K 59/122* (2023.01)

(52) U.S. Cl.
CPC ......... *H10K 50/858* (2023.02); *H10K 59/122* (2023.02)

(58) Field of Classification Search
CPC ...... H10K 30/40; H10K 30/86; H10K 30/865; H10K 39/34; H10K 71/30; H10K 30/85; H10K 30/30; H10K 59/30; H10K 59/40; Y02E 10/549
See application file for complete search history.

(56) References Cited

U.S. PATENT DOCUMENTS 10,388,706 B2 8/2019 Lee et al.
2005/0072971 A1* 4/2005 Marrocco, III ........ B82Y 30/00 257/40
2010/0187521 A1* 7/2010 Park ..................... H10K 85/626 257/40
2012/0152303 A1* 6/2012 Meiss .................. C09B 23/105 585/27
2014/0138636 A1* 5/2014 Song ...................... H10K 50/85 257/40
2016/0204370 A1* 7/2016 Park ...................... H10K 50/18 438/46
2017/0346037 A1* 11/2017 Huang .................. H10K 71/30
2020/0212138 A1* 7/2020 Lee .................... G06V 40/1318
2021/0005669 A1 1/2021 Kamada et al.

FOREIGN PATENT DOCUMENTS

DE 102012105809 1/2014
KR 10-2017-0014797 2/2017
KR 10-2018-0103206 9/2018
KR 10-2205856 1/2021

* cited by examiner

DD'
PXG1
PXG2
PXG3
PXA-R
IPA
PXA-B
PXA-G
NPXA
II
II'
DR1
DR2
DR3
DR4

LIGHT RECEIVING ELEMENT AND ELECTRONIC DEVICE INCLUDING THE SAME

CROSS-REFERENCE TO RELATED APPLICATIONS

This U.S. non-provisional patent application claims priority to and benefits of Korean Patent Application No. 10-2021-0159341 under 35 U.S.C. § 119, filed in the Korean Intellectual Property Office (KIPO) on Nov. 18, 2021, the entire contents of which are incorporated herein by reference.

BACKGROUND

The disclosure herein relates to an electronic device including a light receiving element in an active region.

Various types of electronic devices are used to provide image information, and such electronic devices provide a variety of functions for allowing organic communication with a user, such as sensing an input by the user. Particularly, recent electronic devices include a function for sensing external inputs provided from the outside.

As a method for recognizing an external input, there are methods such as a capacitance method which senses changes in capacitance formed between electrodes, an optical method which senses incident light using an optical sensor, and an ultrasonic method which senses vibration using a piezoelectric body and the like. Meanwhile, when the optical sensor is included, it is necessary to increase the efficiency of converting received light into an electrical signal in order to improve the sensitivity of a light receiving element.

SUMMARY

The disclosure provides an electronic device having improved efficiency in a light receiving element.

An embodiment of the disclosure provides a light receiving element including a first electrode, a hole transport region disposed on the first electrode, a light receiving layer disposed on the hole transport region and converting incident light to an electrical signal, an electron transport region disposed on the light receiving layer, and a second electrode disposed on the electron transport region. The light receiving layer includes a p-dopant compound, a donor compound, and an acceptor compound.

In an embodiment, the light receiving layer may include a p-dopant layer including the p-dopant compound, and an active layer including the donor compound and the acceptor compound.

In an embodiment, the p-dopant layer may be disposed more adjacent to the hole transport region than the active layer.

In an embodiment, the p-dopant layer may further include the donor compound.

In an embodiment, the active layer may be a single layer including the donor compound and the acceptor compound.

In an embodiment, the active layer may include a first layer disposed on the p-dopant layer and including the donor compound, and a second layer disposed on the first layer and including the acceptor compound.

In an embodiment, the active layer may include a first layer disposed on the p-dopant layer and including the donor compound, a second layer disposed on the first layer and including the donor compound and the acceptor compound, and a third layer disposed on the second layer and including the acceptor compound.

In an embodiment, the p-dopant compound may include a metal having a work function of about 5.0 eV or greater, or an organic compound having a HOMO level of about −5.0 eV or less.

In an embodiment, the p-dopant compound may include at least one of a halogenated metal compound, a quinone derivative, a metal oxide, and a cyano group-containing compound.

In an embodiment, the acceptor compound may include a fullerene derivative or a perylene tetracarboxylic diimide (PTCDI) derivative.

In an embodiment, the donor compound may include a phthalocyanine-based compound or a perylene-based compound.

In an embodiment, the light receiving element may further include a capping layer disposed on the second electrode. The refractive index of the capping layer may be about 1.6 or greater.

In an embodiment, the light receiving element may further include a buffer layer disposed between the light receiving layer and the electron transport region.

In an embodiment of the disclosure, an electronic device includes a base layer, and a display element layer disposed on the base layer and including a pixel definition film having an opening, and a light emitting element and a light receiving element divided by the pixel definition film. Each of the light emitting element and the light receiving element includes a first electrode, a hole transport region disposed on the first electrode, an electron transport region disposed on the hole transport region, and a second electrode disposed on the electron transport region. The light emitting element includes a light emitting layer disposed between the hole transport region and the electron transport region, the light receiving element includes a light receiving layer disposed between the hole transport region and the electron transport region, the light receiving element converts incident light to an electrical signal, and the light receiving layer includes a p-dopant compound, a donor compound, and an acceptor compound.

In an embodiment, the light receiving layer may include a p-dopant layer including the p-dopant compound, and an active layer including the donor compound and the acceptor compound.

In an embodiment, the p-dopant layer may further include the donor compound.

In an embodiment, the active layer may be a single layer including the donor compound and the acceptor compound.

In an embodiment, the active layer may include a first layer disposed on the p-dopant layer, and including the donor compound, and a second layer disposed on the first layer, and including the acceptor compound.

In an embodiment, the light emitting element may not include the p-dopant layer.

In an embodiment of the disclosure, an electronic device includes a display module divided into a red light emitting region, a green light emitting region, a blue light emitting region, and a light receiving region spaced apart from each other on a plane. The display module includes a base layer, a display element layer disposed on the base layer, and including a light emitting element and a light receiving element, and an input sensing layer disposed on the display element layer. The display element layer includes a first electrode, a hole transport region disposed on the first electrode, an electron transport region disposed on the hole transport region, and a second electrode disposed on the electron transport region. The light emitting element includes a light emitting layer disposed between the hole transport region and the electron transport region, and overlapping only the red light emitting region, the green light emitting region, and the blue light emitting region. The light receiving element includes a light receiving layer disposed between the hole transport region and the electron transport region, and overlapping only the light receiving region, and the light receiving layer includes a p-dopant compound, a donor compound, and an acceptor compound.

In an embodiment, the light emitting element may include a red light emitting element corresponding to the red light emitting region, a blue light emitting element corresponding to the blue light emitting region, and a green light emitting element corresponding to the green light emitting region.

BRIEF DESCRIPTION OF THE DRAWINGS

The accompanying drawings are included to provide a further understanding of the disclosure, and are incorporated in and constitute a part of this specification. The drawings illustrate some of example embodiments of the disclosure and, together with the description, serve to explain principles of the disclosure. In the drawings:

FIG. 5 is a schematic cross-sectional view showing a portion of a display module according to an embodiment of the disclosure;

FIG. 9 is a schematic cross-sectional view showing a portion of a display module according to an embodiment of the disclosure.

DETAILED DESCRIPTION OF THE EMBODIMENTS

Figure 1:
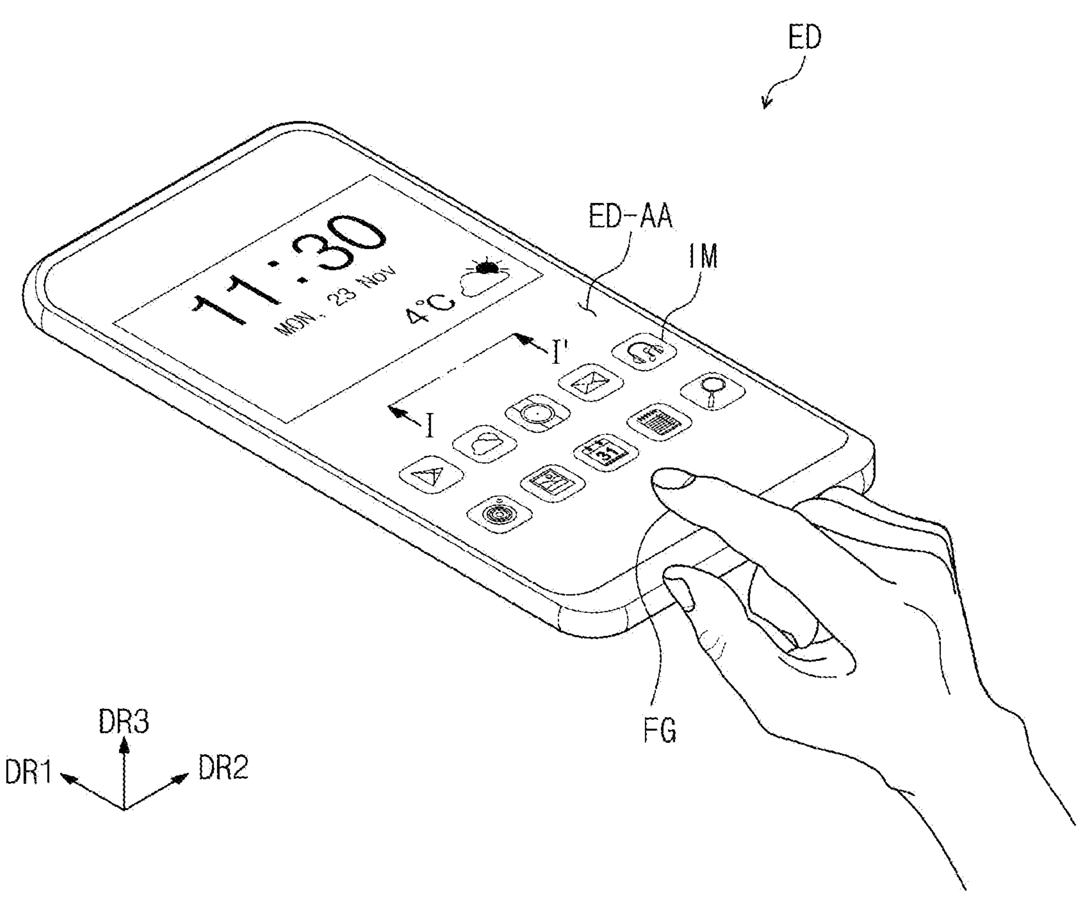
FIG. 1 is a schematic perspective view of an electronic device according to an embodiment of the disclosure.

The disclosure may be modified in many alternate forms, and thus specific embodiments will be illustrated in the drawings as examples and described in detail. It should be understood, however, that it is not intended to limit the disclosure to the particular forms disclosed, but rather, is intended to cover all modifications, equivalents, and alternatives falling within the spirit and scope of the disclosure.

In the disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Meanwhile, in the disclosure, being "directly disposed" may mean that there is no layer, film, region, plate, or the like added between a portion of a layer, a film, a region, a plate, or the like and other portions. For example, being "directly disposed" may mean being disposed without additional members such as an adhesive member between two layers or two members.

It will be understood that the terms "contact," "connected to," and "coupled to" may include a physical and/or electrical contact, connection, or coupling.

The term "overlap" or "at least partially overlap" as used herein may mean that at least part of a first object faces at least part of a second object in a given direction or given view.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Like reference numerals refer to like elements. Also, in the drawings, the thickness, the ratio, and the dimensions of elements may be exaggerated for an effective description of technical contents.

The term "and/or" includes any and all combinations of one or more of which associated elements may define. The phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," and the like may be used herein to describe various elements, these elements should not be limited by these terms. These terms are only used to distinguish one element from another. For example, a first element may be referred to as a second element, and a second element may also be referred to as a first element in a similar manner without departing the scope of rights of the disclosure. The terms of a singular form may include plural forms (or meanings) unless the context clearly indicates otherwise.

In addition, terms such as "below," "lower," "above," "upper," and the like are used to describe the relationship of components shown in the drawings. The terms are used as a relative concept and are described with reference to the direction indicated in the drawings. In the disclosure, being "disposed on" may not only include the case of being disposed on an upper portion of any one member but also the case of being disposed on a lower portion thereof.

Unless otherwise defined or implies herein, all terms (including technical and scientific terms) used herein have the same meaning as commonly understood by one of ordinary skill in the art to which the disclosure pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

It should be understood that the terms "comprise," or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, an electronic device according to an embodiment of the disclosure will be described with reference to the accompanying drawings.

Figure 2:
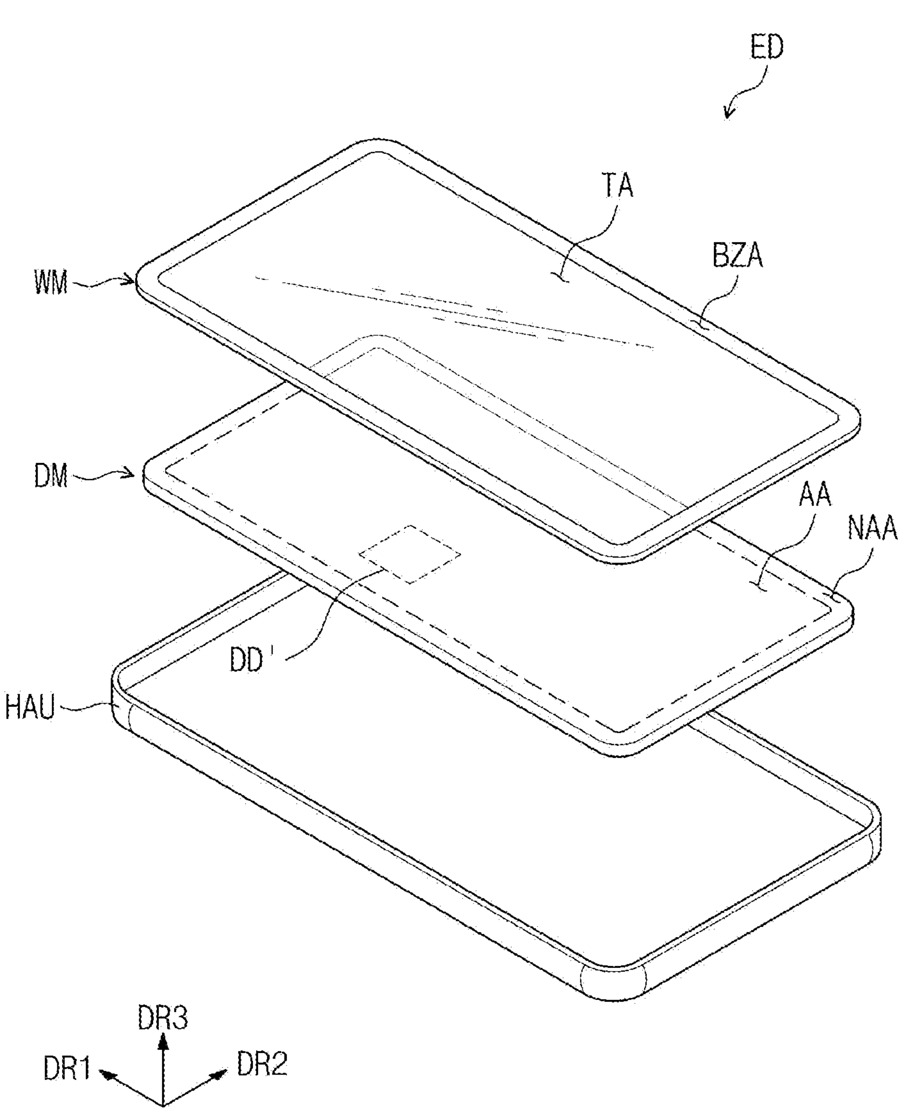
FIG. 2 is a schematic exploded perspective view of an electronic device according to an embodiment of the disclosure.
Figure 3:
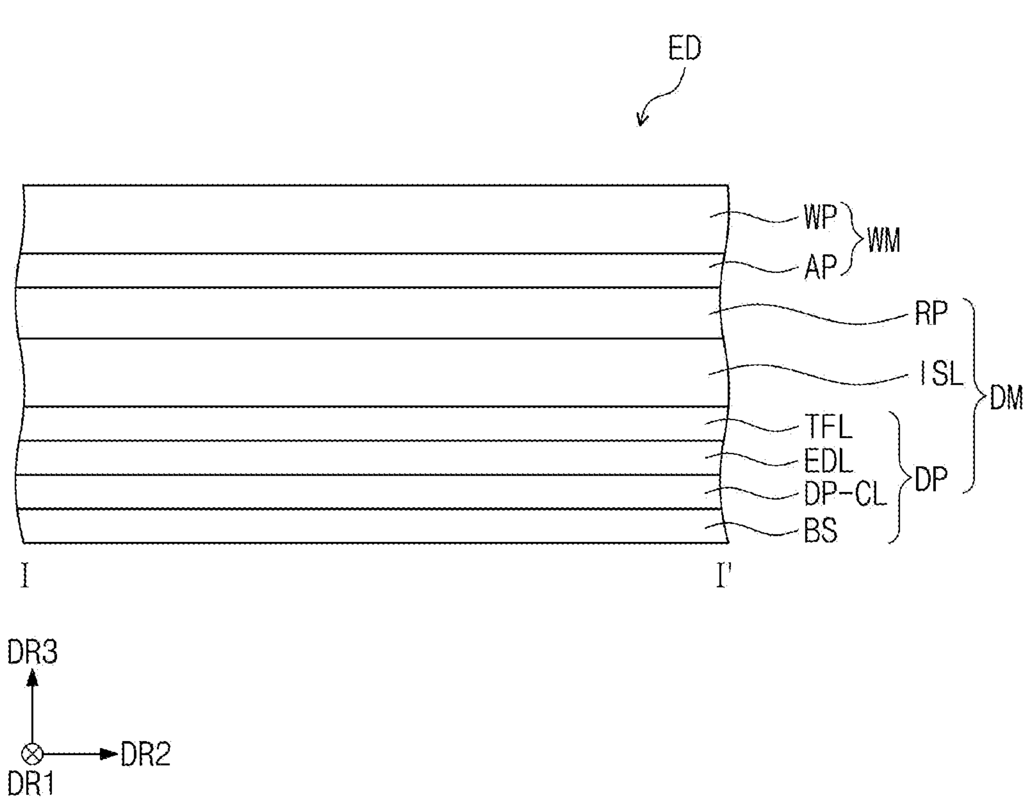
FIG. 3 is a schematic cross-sectional view of an electronic device according to an embodiment of the disclosure.

FIG. 1 is a schematic perspective view illustrating an electronic device according to an embodiment of the disclosure. FIG. 2 is a schematic exploded perspective view of an electronic device according to an embodiment of the disclosure. FIG. 3 is a schematic cross-sectional view schematically illustrating a portion corresponding to line I-I' of FIG. 1.

An electronic device ED of an embodiment illustrated in FIGS. 1 to 3 may be a device activated by an electrical signal. For example, the electronic device ED may be a mobile phone, a tablet computer, a car navigation system, a game console, or a wearable device, but the embodiment is not limited thereto. FIG. 1 illustrates that the electronic device ED is a mobile phone.

The electronic device ED may display an image IM through an active region ED-AA. The active region ED-AA may include a plane defined by a first axis direction DR1 and a second axis direction DR2. The active region ED-AA may further include a curved surface bent from at least one side of the plane defined by the first axis direction DR1 and the second axis direction DR2. For example, the active region ED-AA may include only the plane, or the active region ED-AA may further include four curved surfaces bent from at least two side surfaces, for example, four side surfaces of the plane, respectively.

FIG. 1 and the following drawings illustrate the first axis direction DR1 to a fourth axis direction DR4. Directions indicated by the first to fourth direction axes DR1, DR2, DR3, and DR4 described in the disclosure are relative concepts, and may be changed to different directions. In addition, the directions indicated by the first to fourth direction axes DR1, DR2, DR3, and DR4 may be described as first to fourth directions, and may be denoted by the same reference numerals.

In the disclosure, the first axis direction DR1 and the second axis direction DR2 are perpendicular to each other, and the third axis direction DR3 may be a direction normal to a plane defined by the first axis direction DR1 and the second axis direction DR2. The fourth axis direction DR4 may be a direction between the first axis direction DR1 and the second axis direction DR2.

A thickness direction of the electronic device ED may be a direction parallel to the third axis direction DR3, which is the direction normal to the plane defined by the first axis direction DR1 and the second axis direction DR2. In the disclosure, a front surface (or an upper surface) and a rear surface (or a lower surface) of members constituting the electronic device ED may be defined on the basis of the third axis direction DR3.

The image IM provided in the electronic device ED of an embodiment may include a moving image and a still image. FIG. 1 illustrates, as an example of the image IM, a watch window and icons. A surface on which the image IM is displayed may correspond to a front surface of the electronic device ED, and may correspond to a front surface of a window member WM.

In addition, the electronic device ED according to an embodiment may sense a user input applied from the outside. The user input includes various forms of external inputs such as a part of a user's body, light, heat, or pressure. The electronic device ED of an embodiment may sense a user input through the active region ED-AA, and respond to a sensed input signal. In addition, depending on the design of the electronic device ED provided, the electronic device ED may sense a user input applied to a side surface or a rear surface of the electronic device ED, and is not limited to any one embodiment.

For example, the electronic device ED of an embodiment may sense biometric information such as a user's fingerprint FG applied from the outside. In the active region ED-AA of the electronic device ED, a fingerprint recognizing region may be provided. The fingerprint recognizing region may be provided in all regions of the active region ED-AA, or may be provided in a region of the active region ED-AA. The fingerprint recognizing region may be an external input recognizing region which senses not only the user's biometric information, but also an input provided from the outside.

Referring FIGS. 2 and 3, the electronic device ED of an embodiment may include a display module DM, the window member WM, and a housing HAU. In an embodiment, the window member WM and the housing HAU may be extended to each other to constitute the appearance of the electronic device ED.

In an embodiment, the display module DM may be divided into an active region AA and a peripheral region NAA. The active region AA may be a region activated by an electrical signal. As described above, the active region AA may be a portion which displays an image, or senses an external input.

The peripheral region NAA may be a region positioned adjacent to at least one side of the active region AA. The peripheral region NAA may be disposed surrounding the active region AA. However, the embodiment of the disclosure is not limited thereto, and unlike what is illustrated in FIG. 2 and the like, in an embodiment, a portion of the peripheral region NAA may be omitted. In the peripheral region NAA, a driving circuit or a driving line for driving the active region AA may be disposed.

Figure 5:
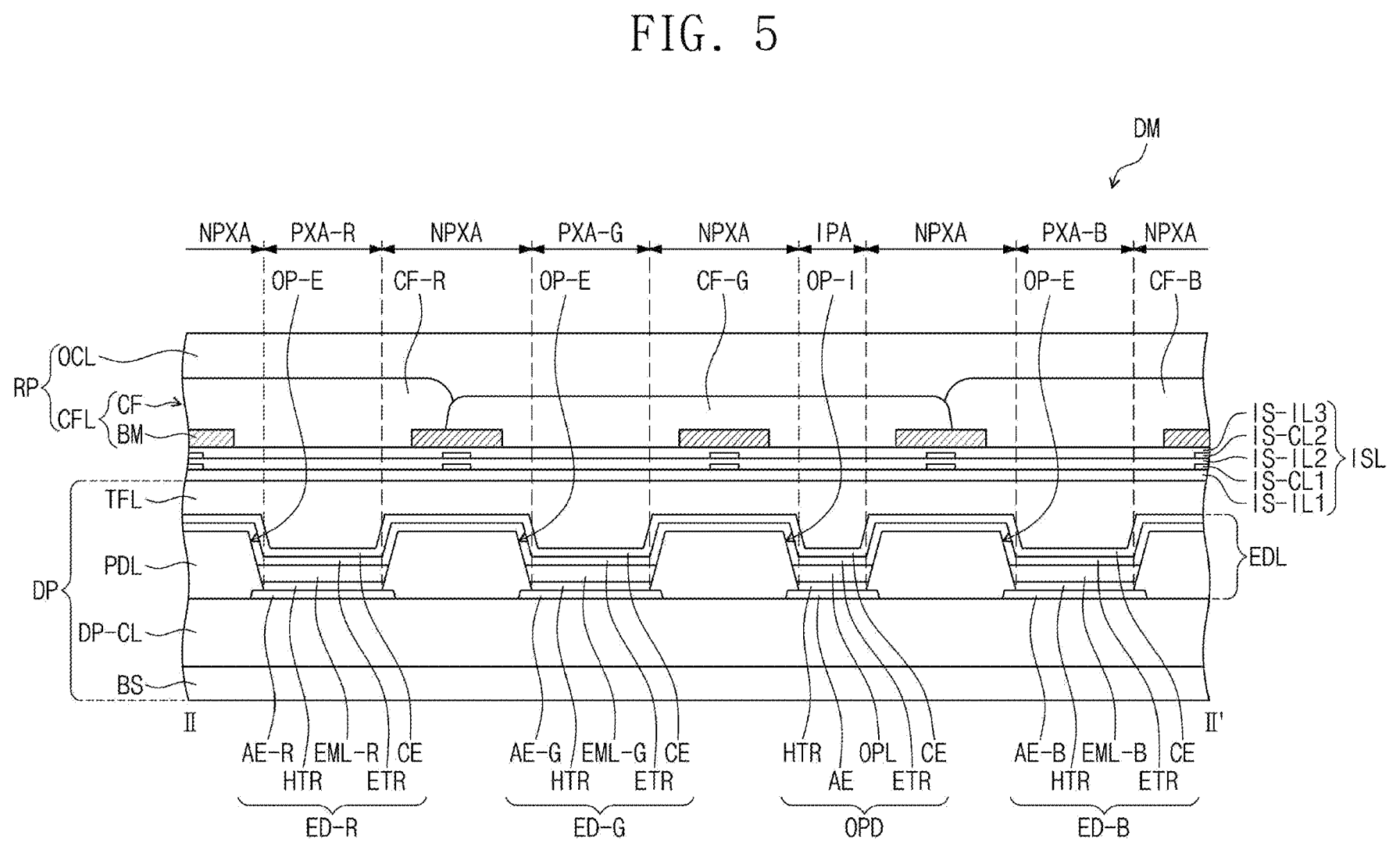

The electronic device ED according to an embodiment may include light emitting elements ED-R, ED-G, and ED-B (see FIG. 5) and a light receiving element OPD (see FIG. 5). For example, the electronic device ED according to an embodiment may display an image through the operation of the light emitting elements ED-R, ED-G, and ED-B (see FIG. 5), and may sense an external input through the operation of the light receiving element OPD (see FIG. 5).

The display module DM according to an embodiment may include a display panel DP and an input sensing layer ISL disposed on the display panel DP. In addition, the display module DM may include a reflection prevention member RP. In an embodiment, the reflection prevention member RP may be disposed on the input sensing layer ISL. In addition, in case that the input sensing layer ISL is omitted, the reflection prevention member RP may be disposed on an upper portion of the display panel DP.

The display panel DP may include a base layer BS, and a display element layer EDL disposed on the base layer BS. In addition, the display panel DP may include the base layer BS, a circuit layer DP-CL disposed on the base layer BS, the display element layer EDL disposed on the circuit layer DP-CL, and an encapsulation layer TFL disposed on the display element layer EDL. The encapsulation layer TFL may cover the display element layer EDL.

The electronic device ED of an embodiment may further include the window member WM disposed on the display module DM. The window member WM may include a window WP and an adhesive layer AP, and the adhesive layer AP may be disposed between the display module DM and the window WP. The adhesive layer AP may be an optically clear adhesive film (OCA film) or an optically clear adhesive resin layer (OCR layer). In an embodiment, the adhesive layer AP may be omitted.

The window WP may cover the entire outside of the display module DM. The window WP may have a shape corresponding to the shape of the display module DM. In the electronic device ED of an embodiment, the window WP may include an optically transparent insulation material. The window WP may be a glass substrate or a polymer substrate. For example, the window WP may be a tempered glass substrate. The window WP may correspond to the uppermost layer of the electronic device ED.

In addition, in the electronic device ED of an embodiment, the window member WM may be divided into a transmission portion TA and a bezel portion BZA. The transmission portion TA may be a portion corresponding to the active region AA of the display module DM, and the bezel portion BZA may be a portion corresponding to the peripheral region NAA of the display module DM.

The front surface of the window member WM including the transmission portion TA and the bezel portion BZA corresponds to the front surface of the electronic device ED. A user may visually recognize an image provided through the transmission portion TA corresponding to the front surface of the electronic device ED.

The bezel portion BZA may define the shape of the transmission portion TA. The bezel portion BZA is adjacent to the transmission portion TA, and may surround the transmission portion TA. However, the embodiment is not limited to what is illustrated, and the bezel portion BZA may be disposed adjacent to only a side of the transmission portion TA, and a portion of the bezel portion BZA may be omitted.

In the electronic device ED of an embodiment, a portion of the electronic device ED visually recognized through the bezel portion BZA may have relatively low light transmittance compared to a portion thereof visually recognized through the transmission portion TA. In addition, in the electronic device ED of an embodiment, the bezel portion BZA may be a portion visually recognized as having a color.

In the electronic device ED of an embodiment, the reflection prevention member RP may include a color filter layer or a polarizing layer. For example, the reflection prevention member RP may reduce the reflectance of external light incident from the outside, or may absorb and block a portion of light incident from the outside.

The input sensing layer ISL included in the electronic device ED of an embodiment may be disposed on the display panel DP. The input sensing layer ISL may sense an external input applied from the outside. The external input may be a user input. The user input includes various forms of external inputs such as a part of a user's body, light, heat, a pen, and pressure.

Figure 4:
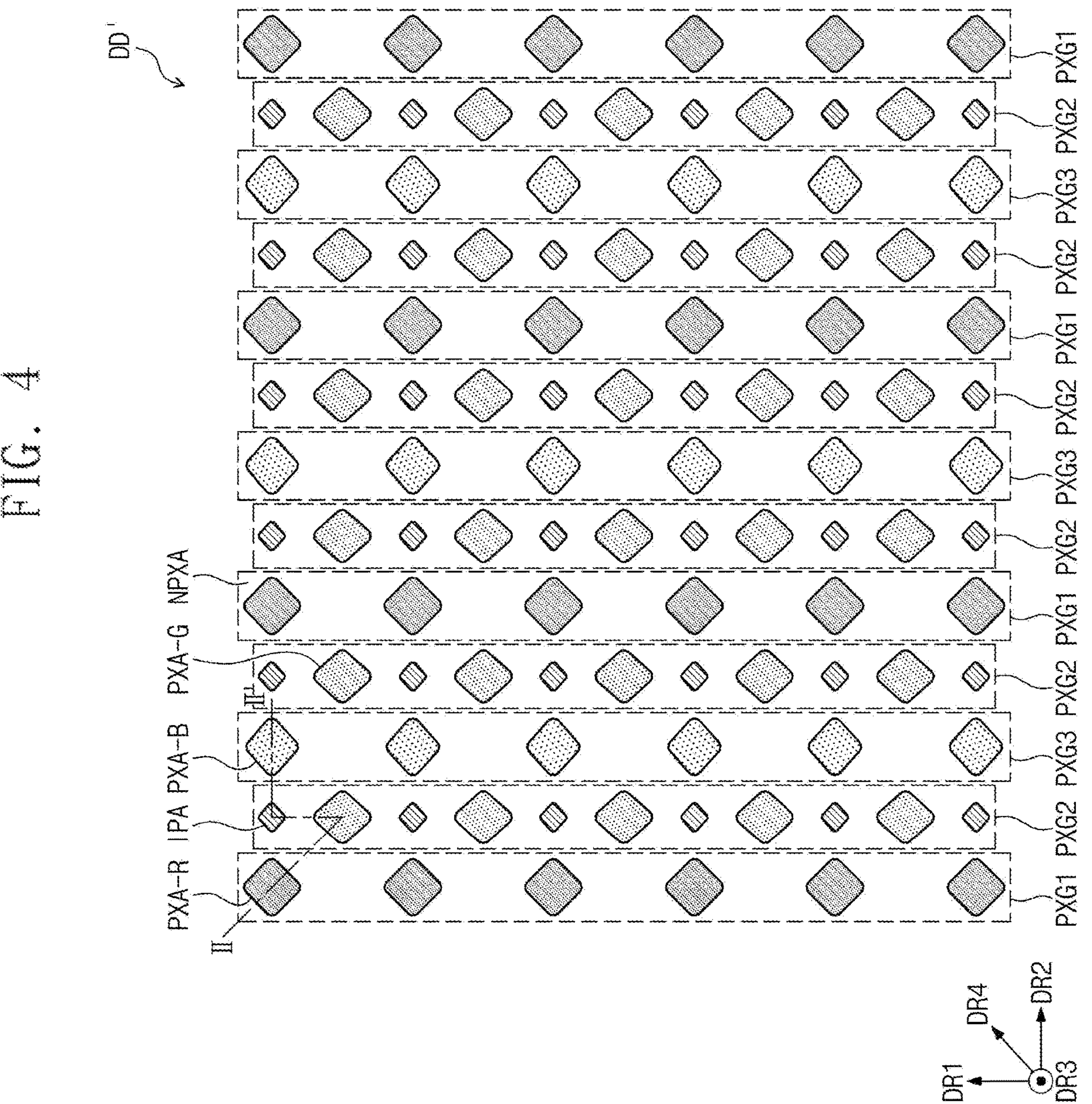
FIG. 4 is a schematic plan view of a portion of a display module according to an embodiment of the disclosure.

FIG. 4 is a schematic plan view illustrating a portion of a display module according to an embodiment of the disclosure. FIG. 5 is a schematic cross-sectional view illustrating a portion of a display module according to an embodiment of the disclosure. FIG. 4 is a schematic plan view illustrating region DD' of FIG. 2, and FIG. 5 is a schematic cross-sectional view illustrating a portion corresponding to line II-II' of FIG. 4.

The display module DM according to an embodiment may include light emitting regions PXA-R, PXA-G, and PXA-B and a light receiving region IPA disposed in the active region AA. The display module DM may include a red light emitting region PXA-R which emits red light, a green light emitting region PXA-G which emits green light, and a blue light emitting region PXA-B which emits blue light. In addition, the display module DM may include the light receiving region IPA which receives and senses light reflected off or from an external object and incident thereon. Between the light emitting regions PXA-R, PXA-G, and PXA-B, and between the light emitting regions PXA-R, PXA-G, and PXA-B and the light receiving region IPA, a non-light emitting region NPXA may be disposed. The light emitting regions PXA-R, PXA-G, and PXA-B, and the light emitting regions PXA-R, PXA-G, and PXA-B and the light receiving region IPA may be divided from each other by the non-light emitting region NPXA. The non-light emitting region NPXA may surround each of the light emitting regions PXA-R, PXA-G, and PXA-B and the light receiving region IPA.

In an embodiment, among the light emitting regions PXA-R, PXA-G, and PXA-B, light emitting regions which emit light of different wavelength regions may have different areas. In this case, the area may mean the area when viewed on a plane defined by the first axis direction DR1 and the second axis direction DR2.

However, the embodiment of the disclosure is not limited thereto. The light emitting regions PXA-R, PXA-B, and PXA-B may have a same area, or the light emitting regions PXA-G, PXA-B, and PXA-B may be provided at area ratios different from what is illustrated in FIG. 4. The light emitting regions PXA-G, PXA-B, and PXA-B may emit light of different colors other than red light, green light, and blue light, or may have different planar shapes from the shapes illustrated.

In an embodiment, the area of the light receiving region IPA in a plan view may be smaller than the area of each of the red light emitting region PXA-R, the blue light emitting region PXA-B, and the green light emitting region PXA-G. However, the embodiment of the disclosure is not limited thereto. The area of the light receiving region IPA may be the same as or larger than the area of any one light emitting region among the red light emitting region PXA-R, the blue light emitting region PXA-B, and the green light emitting region PXA-G.

Referring to FIG. 4, red light emitting regions PXA-R may be arranged spaced apart from each other in the first axis direction DR1 and form a first group PXG1. Green light emitting regions PXA-G and light receiving regions IPA may be alternately arranged in the first axis direction DR1 and form a second group PXG2. In addition, blue light emitting regions PXA-B may be arranged spaced apart from each other in the first axis direction DR1 and form a third group PXG3.

The first to third groups PXG1 to PXG3 may be disposed in order in the second axis direction DR2. The first to third groups PXG1 to PXG3 may each be provided in plurality. In an embodiment illustrated in FIG. 4, the first group PXG1, the second group PXG2, the third group PXG3, and the second group PXG forms a repeating unit in the second axis direction DR2, and these repeating units may be arranged repeatedly in the second direction DR2.

In an embodiment, a green light emitting region PXA-G may be disposed spaced apart from a red light emitting region PXA-R or a blue light emitting region PXA-B in a fourth axis direction DR4. The fourth axis direction DR4 may be a direction between the first axis direction DR1 and the second axis direction DR2.

In addition, in an embodiment, the light receiving region IPA is spaced apart from each of the light emitting regions PXA-R, PXA-G, and PXA-B, and may be disposed between the red light emitting region PXA-R and the blue light emitting region PXA-B spaced apart from each other in the second axis direction DR2. The light receiving region IPA and the green light emitting region PXA-G may be alternately arranged one by one in the first axis direction DR1.

The arrangement structure of the light emitting regions PXA-R, PXA-G, and PXA-B illustrated in FIG. 4 may be referred to as a PENTILE® structure. However, the arrangement structure of the light emitting regions PXA-R, PXA-G, and PXA-B in an electronic device according to an embodiment is not limited to the arrangement structure illustrated in FIG. 4. For example, in an embodiment, the light emitting regions PXA-R, PXA-G, and PXA-B may have a stripe structure in which the red light emitting region PXA-R, the green light emitting region PXA-G, and the blue light emitting region PXA-B are sequentially and alternately arranged in the first axis direction DR1 or the second axis direction DR2. In addition, in the stripe arrangement structure, the light receiving region IPA and the green light emitting region PXA-G may form a same row or column to form a stripe structure. However, in an embodiment, the arrangement form of the light receiving region IPA and the light emitting regions PXA-R, PXA-G, and PXA-B, and the arrangement ratio and the like of the light receiving region IPA and the light emitting regions PXA-R, PXA-G, and PXA-B may be different from the above-described arrangement form.

FIG. 5 is a schematic cross-sectional view of a portion of a display module according to an embodiment of the disclosure. The cross-sectional view of FIG. 5 illustrates, as an example, a portion of the light emitting regions PXA-R, PXA-G, and PXA-B, and the light receiving region IPA illustrated in FIG. 4. For example, FIG. 5 is a schematic cross-sectional view illustrating a portion of the electronic device ED (see FIG. 3) according to an embodiment.

The electronic device ED of an embodiment may include light emitting elements ED-R, ED-G, and ED-B and a light receiving element OPD. The light emitting elements ED-R, ED-G, and ED-B may emit light according to an electrical signal. In addition, the light receiving element OPD may receive an optical signal and convert the same to an electrical signal.

Referring to FIG. 5, the electronic device of an embodiment may include the base layer BS, the display element layer EDL disposed on the base layer BS, the input sensing layer ISL disposed on the display element layer EDL, and the reflection prevention member RP disposed on the input sensing layer ISL. The display element layer EDL may include a pixel definition film PDL, and the light emitting elements ED-R, ED-G, and ED-B and the light receiving element OPD divided by the pixel definition film PDL. In addition, the reflection prevention member RP may include a color filter layer CFL and an organic planarization layer OCL.

In an embodiment, the light emitting elements ED-R, ED-G, and ED-B may include first electrodes AE-R, AE-G, and AE-B, a hole transport region HTR, light emitting layers EML-R, EML-G, and EML-B, an electron transport region ETR, and a second electrode CE. In addition, the light receiving element OPD may include a first electrode AE, the hole transport region HTR, the light receiving layer OPL, an electron transport region ETR, and the second electrode CE which are sequentially stacked. A light receiving layer OPL may include a p-dopant layer p-DL.

In an embodiment, the light emitting layers EML-R, EML-G, and EML-B included in the light emitting elements ED-R, ED-G, and ED-B may be layers which spontaneously emit light by including an organic light emitting material and/or an inorganic light emitting material. The light emitting elements ED-R, ED-G, and ED-B may recombine holes and electrons injected from each electrode in the light emitting layers EML-R, EML-G, and EML-B.

In an embodiment, the light receiving layer OPL included in the light receiving element OPD may be a photoactive layer which converts incident light into an electrical signal. The light receiving element OPD may separate provided light into electrons and holes, and transmit the electrons and the holes to the side of each electrode.

In an embodiment, the light emitting elements ED-R, ED-G, ED-B may be disposed respectively overlapping the light emitting regions PXA-R, PXA-G, and PXA-B. For example, the light emitting layers EML-R, EML-G, and EML-B included only in the light emitting elements ED-R, ED-G, and ED-B may be disposed overlapping only the light emitting regions PXA-R, PXA-G, and PXA-B, and not overlapping the light receiving region IPA.

In an embodiment, the light receiving element OPD may be disposed overlapping the light receiving region IPA. For example, the light receiving layer OPL included only in the light receiving element OPD may be disposed overlapping only the light receiving region IPA, and not overlapping the light emitting regions PXA-R, PXA-G, and PXA-B.

Figure 6:
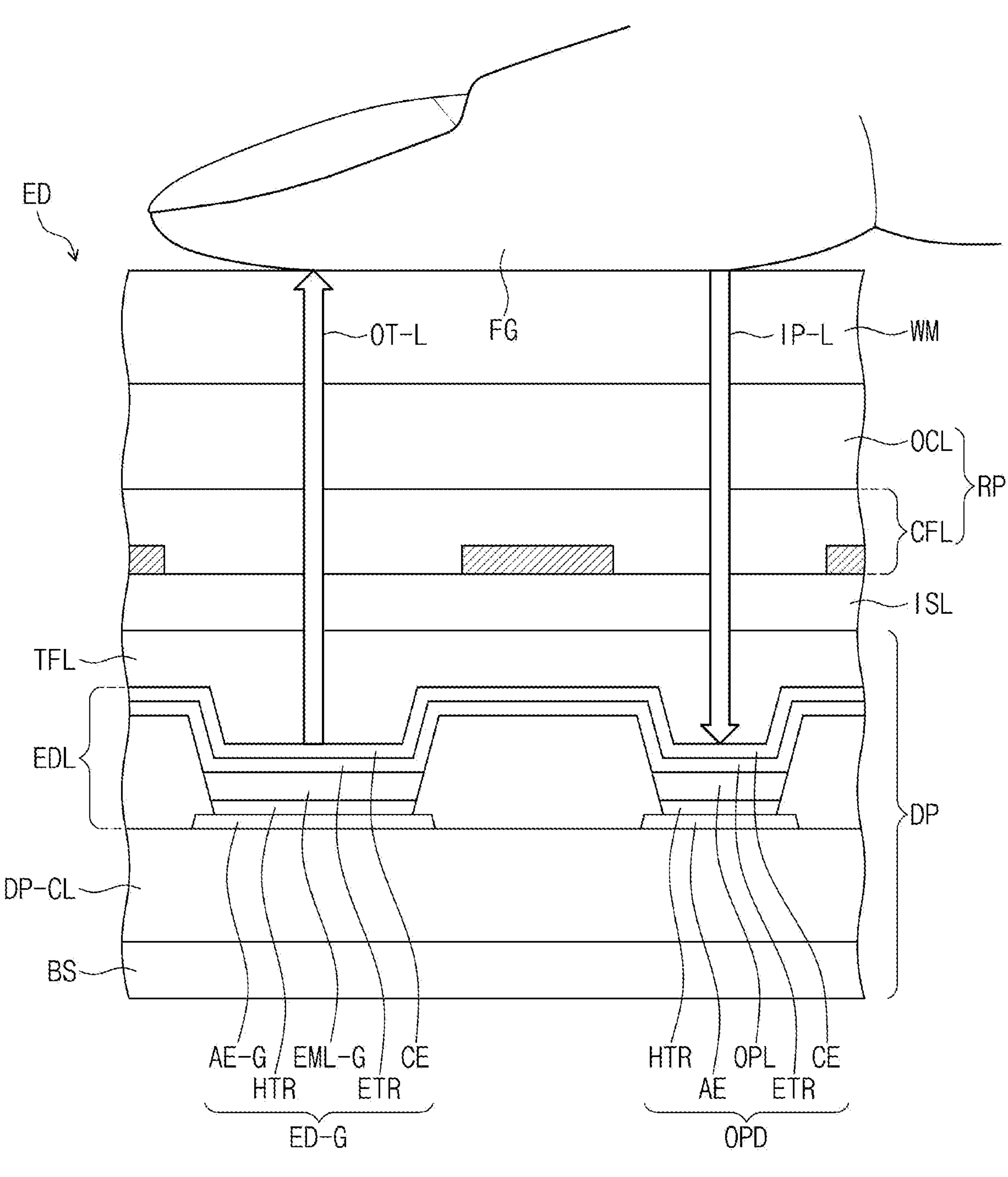
FIG. 6 is a schematic cross-sectional view showing an electronic device according to an embodiment of the disclosure.

FIG. 6 is a schematic cross-sectional view illustrating a portion of an electronic device according to an embodiment of the disclosure. FIG. 6 schematically illustrates the operation form of a light emitting element and a light receiving element. Referring to FIG. 6, in the electronic device ED according to an embodiment, light OT-L emitted from the light emitting element ED-G included in the display element layer EDL may be reflected off an external object (e.g., the fingerprint FG in the embodiment), and be incident as reflected light IP-L on the light receiving element OPD included in the display element layer EDL. The reflected light IP-L incident on the light receiving element OPD may be light of a visible light region. The light receiving element OPD may change the driving state of the electronic device ED by receiving incident light and converting the received incident light to an electrical signal to recognize an external input.

For example, light emitted from the light emitting element ED-G and reflected off an external object is incident on the light receiving element OPD, and by the incident light, holes and electrons are separated from each other in the light receiving layer OPL of the light receiving element OPD to be transmitted to each electrode AE and CE. Accordingly, an optical signal is converted to an electrical signal.

Referring back to FIG. 5, the electronic device of an embodiment includes the base layer BS of the display module DM. The base layer BS may be a member which provides a base surface on which the display element layer EDL is disposed. The base layer BS may be a glass substrate, a metal substrate, a polymer substrate, and the like. However, the embodiment of the disclosure is not limited thereto. The base layer BS may be an inorganic layer, an organic layer, or a composite material layer.

The base layer BS may have a multi-layered structure. For example, the base layer BS may have a three-layered structure of a synthetic resin layer, an adhesive layer, and a synthetic resin layer. Particularly, the synthetic resin layer may include a polyimide-based resin. In addition, the synthetic resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In the disclosure, " . . . -based" resin means that a functional group of " . . . " is included.

The circuit layer DP-CL is disposed on the base layer BS. The circuit layer DP-CL may include an insulation layer, a semiconductor pattern, a conductive pattern, a signal line, and the like. An insulation layer, a semiconductor layer, and a conductive layer are formed above the base layer BS by coating or deposition, and the insulation layer, the semiconductor layer, and the conductive layer may be selectively patterned by performing a photolithography process multiple times. Thereafter, the semiconductor pattern, the conductive pattern, and the signal line included in the circuit layer DP-CL may be formed.

The display element layer EDL may be disposed on the circuit layer DP-CL. The display element layer EDL includes the light emitting elements ED-R, ED-G, and ED-B, and the light receiving element OPD. For example, the light emitting elements ED-R, ED-G, and ED-B included in the display element layer EDL may include an organic light emitting element, a quantum dot light emitting element, a micro-LED light emitting element, or a nano-LED light emitting element. However, the embodiment of the disclosure is not limited thereto. The light emitting elements ED-R, ED-G, and ED-B may include various embodiments as long as light may be generated according to an electrical signal or the amount of light may be controlled.

In addition, in an embodiment, the light receiving element OPD may be an optical sensor which receives and recognizes light reflected off an external object. Specifically, the light receiving element OPD may be an optical sensor which recognizes light of a visible light region reflected off an external object. In an embodiment, the light receiving element OPD may be a biometric sensor which recognizes light reflected off a body part of a user, such as a fingerprint and a vein, and converts an optical signal to an electrical signal.

The display element layer EDL includes the pixel definition film PDL on which openings OP-E and OP-I are defined, and based on the pixel definition film PDL, the light emitting elements ED-R, ED-G, and ED-B, and the light receiving element OPD may be separated and divided from each other. In the pixel definition film PDL, a first opening OP-E in which components of the light emitting elements ED-R, ED-G, and ED-B are disposed, and a second opening OP-I in which components of the light emitting receiving OPD are disposed, are defined.

The pixel definition film PDL may disposed on the base layer BS. The pixel definition film PDL is disposed on the circuit layer DP-CL, and a portion of upper surfaces of the first electrodes AE-R, AE-G, AE-B, and AE may be exposed in the openings OP-E and OP-I. In the embodiment, the light emitting regions PXA-R, PXA-G, and PXA-B and the light receiving region IPA are defined to correspond to regions of the first electrodes AE-R, AE-G, AE-B, and AE exposed through the openings OP-E and OP-I.

In an embodiment, the pixel definition film PDL may be formed of a polymer resin. For example, the pixel definition film PDL may be formed by including a polyacrylate-based resin or a polyimide-based resin. Also, the pixel definition film PDL may be formed by further including an inorganic matter in addition to the polymer resin. The pixel definition film PDL may be formed by including a light absorbing material, or may be formed by including a black pigment or a black dye. The pixel defining film PDL formed by including a black pigment or a black dye may implement a black pixel defining film. In case that the pixel defining film PDL is formed, carbon black and the like may be used as a black pigment or a black dye, but the embodiment of the disclosure is not limited thereto.

Also, the pixel definition film PDL may be formed of an inorganic matter. For example, the pixel definition film PDL may be formed by including silicon nitride ($SiN_x$), silicon oxide ($SiO_x$), silicon oxide ($SiO_xN_y$), or the like.

Each of the light emitting elements ED-R, ED-G, and ED-B may include the first electrodes AE-R, AE-G, and AE-B, the second electrode CE, and the light emitting layers EML-R, EML-G, and EML-B. The first electrodes AE-R, AE-G, and AE-B may be exposed through the first opening OP-E. In the disclosure, the first electrodes AE-R, AE-G, and AE-B forming the light emitting elements ED-R, ED-G, and ED-B may be referred to as light emitting electrodes.

In an embodiment, the display element layer EDL may include a red light emitting element ED-R disposed corresponding to the red light emitting region PXA-R and configured to emit red light, a green light emitting element ED-G disposed corresponding to the green light emitting region PXA-G and configured to emit green light, and a blue light emitting element ED-B disposed corresponding to the blue light emitting region PXA-B and configured to emit blue light. The red light emitting element ED-R includes the first electrode AE-R and the second electrode CE facing each other, and a red light emitting layer EML-R disposed between the first electrode AE-R and the red light emitting layer EML-R. The green light emitting element ED-G includes the first electrode AE-G and the second electrode CE facing each other, and a green light emitting layer EML-G disposed between the first electrode AE-G and the second electrode CE, and the blue light emitting element ED-B includes the first electrode AE-B and the second electrode CE facing each other, and a blue light emitting layer EML-B disposed between the first electrode AE-B and the second electrode CE.

The light receiving element OPD may include the light receiving layer OPL disposed between the first electrode AE and the second electrode CE. The first electrode AE may be exposed in or through the second opening OP-I. In the disclosure, the first electrode AE forming the light receiving element OPD may be referred to as a light receiving electrode.

Figure 7A:
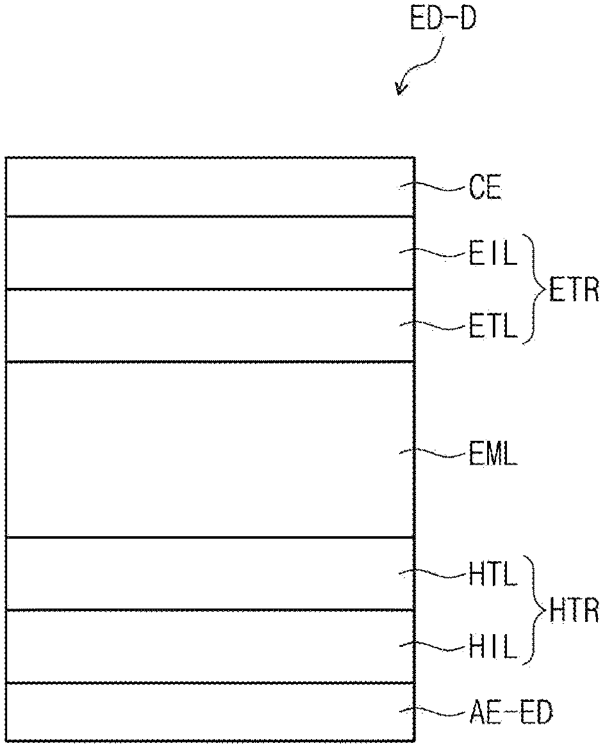
FIG. 7A is a schematic cross-sectional view showing a light emitting element according to an embodiment of the disclosure.
Figure 7B:
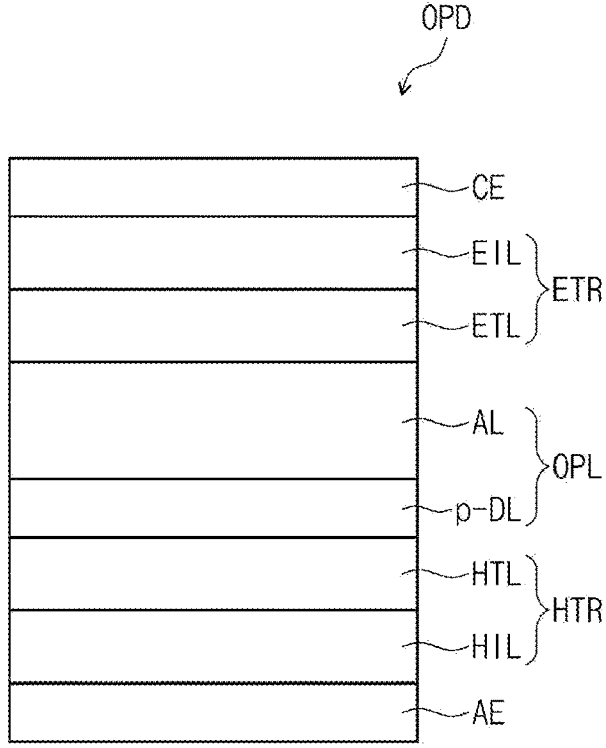
FIG. 7B to FIG. 7D are schematic cross-sectional views showing a light receiving element according to an embodiment of the disclosure.
Figure 7C:
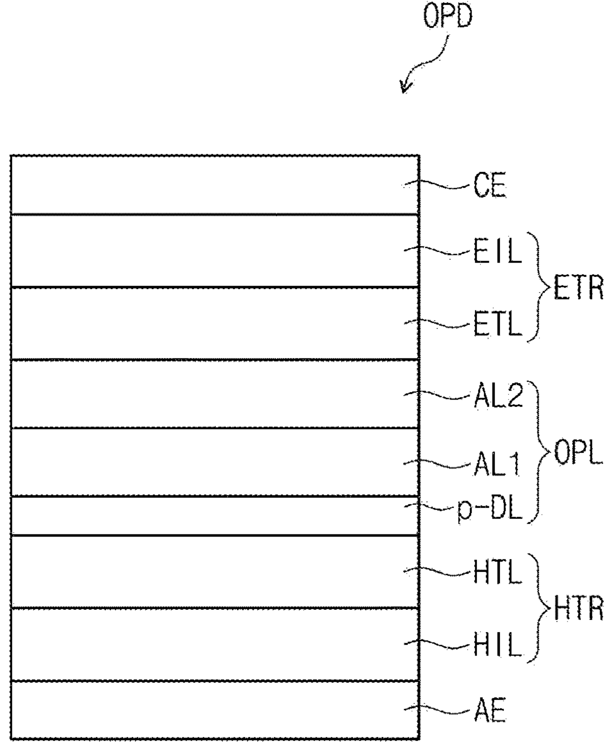
Figure 7D:
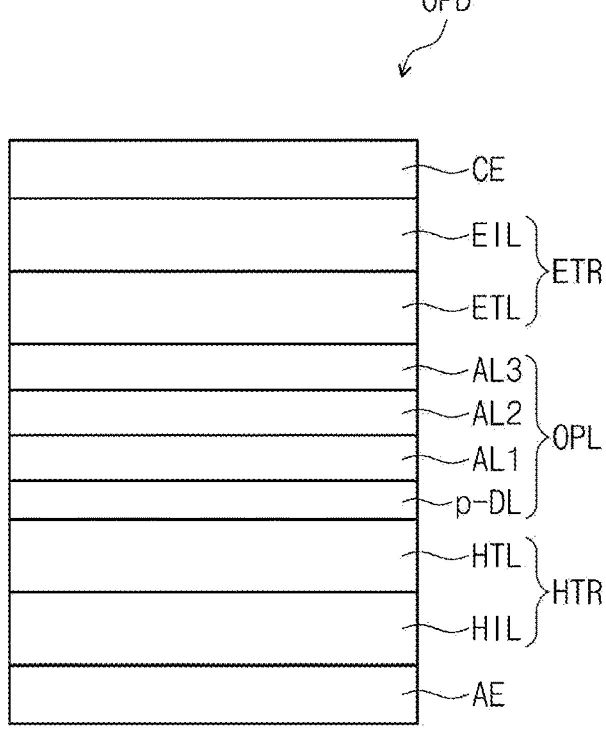

FIGS. 7A to 7D illustrate cross-sections of a light emitting element and a light receiving element. FIG. 7A is a schematic cross-sectional view illustrating a light emitting element according to an embodiment of the disclosure, and FIGS. 7B to 7D are schematic cross-sectional views illustrating a light receiving element according to an embodiment of the disclosure.

A light emitting element ED-D according to an embodiment shown in FIG. 7A are illustrated to represent each of the light emitting elements ED-R, ED-G, and ED-B in FIG. 5. Each of the light emitting elements ED-R, ED-G, and ED-B illustrated in FIG. 5 differs from the light emitting element ED-D illustrated in FIG. 7A only in the configuration of a light emitting layer.

Referring to FIG. 7A, the light emitting element ED-D according to an embodiment may include a first electrode AE-ED, a hole transport region HTR, a light emitting layer EML, an electron transport region ETR, and a second electrode CE which are sequentially stacked. The hole transport region HTR may include a hole injection layer HIL and a hole transport layer HTL, and the electron transport region ETR may include an electron injection layer EIL and an electron transport layer ETL.

Referring to FIG. 7B, the light receiving element OPD according to an embodiment may include the first electrode AE, the hole transport region HTR, the light emitting layer OPL, the electron transport region ETR, and the second electrode CE which are sequentially stacked. The hole transport region HTR may include the hole injection layer HIL and the hole transport layer HTL, and the electron transport region ETR may include the electron injection layer EIL and the electron transport layer ETL. The light receiving layer OPL is disposed between the hole transport region HTR and the electron transport region ETR, and may include the p-dopant layer p-DL and an active layer AL.

In the light emitting element ED-D and the light receiving element OPD illustrated in FIGS. 7A to 7D, first electrodes AE-ED and AE may be formed of a metal material, a metal alloy, or a conductive compound. The first electrodes AE-ED and AE may be an anode or a cathode. However, the embodiment of the disclosure is not limited thereto. In addition, the first electrodes AE-ED and AE may be a pixel electrode or a sensing electrode. The first electrodes AE-ED and AE may be a transmissive electrode, a transflective electrode, or a reflective electrode. In case that the first electrodes AE-ED and AE are each a transmissive electrode, the first electrodes AE-ED and AE may each include a transparent metal oxide, for example, indium tin oxide (ITO), indium zinc oxide (IZO), zinc oxide (ZnO), indium tin zinc oxide (ITZO), or the like. In case that the first electrodes AE-ED and AE are each a transmissive electrode or a transflective electrode, the first electrodes AE-ED and AE may include Ag, Mg, Cu, Al, Pt, Pd, Au, Ni, Nd, Ir, Cr, Li, Ca, LiF/Ca, LiF/Al, Mo, Ti, W, or a compound or mixture thereof (for example, a mixture of Ag and Mg).

The second electrode CE may be a common electrode. The second electrode CE may be a cathode or an anode, but the embodiment of the disclosure is not limited thereto. For example, in case that the first electrodes AE-ED and AE are anodes, the second electrode CE may be a cathode, and in case that the first electrodes AE-ED and AE are cathodes, the second electrode CE may be an anode.

The second electrode CE may be a transmissive electrode, a transflective electrode, or a reflective electrode. In case that the second electrode CE is a transmissive electrode, the second electrode CE may be formed of a transparent metal oxide, for example, indium tin oxide (ITO), indium zinc oxide (IZO), zinc oxide (ZnO), indium tin zinc oxide (ITZO), or the like. In case that the second electrode CE is a transflective electrode or a reflective electrode, the second electrode CE may include Ag, Mg, Cu, Al, Pt, Pd, Au, Ni, Nd, Ir, Cr, Li, Ca, LiF/Ca, LiF/Al, Mo, Ti, Yb, W, or a compound or mixture thereof (for example, AgMg, AgYb, or MgYb).

The first electrodes AE-ED and AE included in the light receiving element OPD of the light emitting element ED-D may be a transflective electrode or a reflective electrode, and the second electrode CE included therein may be a transmissive electrode or a transflective electrode. For example, in an embodiment, a transmissive or transflective second electrode CE is included, so that light reflected off an external object may be easily transmitted to the light receiving element OPD.

The hole transport region HTR may have a single-layered structure having a single layer formed of a single material, a single-layered structure having a single layer formed of different materials, or a multi-layered structure having layers formed of different materials. For example, unlike what is illustrated, the hole transport region HTR may be provided as a single layer without being divided into layers.

Referring to FIGS. 7A to 7D, the hole transport region HTR may include the hole injection layer HIL and the hole transport layer HTL sequentially stacked. Although not illustrated, the hole transport region HTR may further include at least one of a hole buffer layer (now shown), a light emitting auxiliary layer (now shown), or an electron blocking layer (now shown).

The hole injection layer HIL may include, for example, a phthalocyanine compound such as copper phthalocyanine, $N^1$,$N^{1'}$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino]triphenylamine (m-MTDATA), 4,4'4"-Tris(N,N-diphenylamino)triphenylamine (TDATA), 4,4',4"-tris[N(2-naphthyl)-N-phenylamino]-triphenylamine (2-TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonicacid (PANI/CSA), Polyaniline/Poly(4-styrenesulfonate) (PANI/PSS), N,N'-di(naphthalene-1-yl)-N,N'-diphenyl-benzidine (NPB), triphenylamine-containing polyether ketone (TPAPEK), 4-Isopropyl-4'-methyldiphenyliodonium [Tetrakis(pentafluorophenyl)borate], dipyrazino[2,3-f: 2',3'-h] quinoxaline-2,3,6,7,10,11-hexacarbonitrile (HAT-CN), and the like.

The hole transport layer HTL may include, for example, a carbazole-based derivative such as N-phenylcarbazole and polyvinylcarbazole, a fluorene-based derivative, a triphenylamine-based derivative such as N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N'-di (naphthalene-1-yl)-N,N'-diplienyl-benzidine (NPB), 4,4'-Cyclohexylidene bis[N,N-bis(4-methylphenyl)benzenamine] (TAPC), 4,4'-Bis[N,N'-(3-tolyl)amino]-3,3'-dimethylbiphenyl (HMTPD), (1,3-Bis(N-carbazolyl) benzene (mCP), 4,4'-Bis(carbazol-9-yl)biphenyl (CBP), and the like.

However, the embodiment of the disclosure is not limited thereto. The hole injection layer HIL and the hole transport layer HTL may include a hole injection layer material or a hole transport layer material in addition to the above-described materials.

In the light emitting element ED-D, the light emitting layer EML is provided on the hole transport region HTR. The light emitting layer EML may have a single-layered structure having a single layer formed of a single material, a single-layered structure having a single layer formed of different materials, or a multi-layered structure having layers formed of different materials.

In the light emitting element ED-D of an embodiment, the light emitting layer EML may include an organic light emitting material, or a quantum dot material. For example, the light emitting layer EML may include, as an organic light emitting material, an anthracene derivative, a pyrene derivative, a fluoranthene derivative, a chrysene derivative, a dihydrobenz anthracene derivative, or a triphenylene derivative.

In addition, in the light emitting element ED-D of an embodiment, the light emitting layer EML may include a host and a dopant. The light emitting layer EML may include, as a dopant material, an organic fluorescent dopant material, an organic phosphorescent dopant material, a thermally activated delayed fluorescent dopant material, a phosphorescent dopant material of an organometallic complex, or the like.

The light emitting layer EML may include, as a host material, at least one of Bis[2-(diphenylphosphino)phenyl] ether oxide (DPEPO), 4,4'-Bis(carbazol-9-yl)biphenyl (CBP), 1,3-Bis(carbazol-9-yl)benzene (mCP), 2,8-Bis(diphenylphosphoryl)dibenzo[b,d]furan (PPF), 4,4',4"-Tris (carbazol-9-yl)-triphenylamine (TCTA), or 1,3,5-tris(1-phenyl-1H-benzo[d]imidazole-2-yl)benzene (TPBi). However, the embodiment of the disclosure is not limited thereto. For example, tris(8-hydroxyquinolino)aluminum ($Alq_3$), poly (N-vinylcarbazole (PVK), 9,10-di(naphthalene-2-yl)anthracene (ADN), 4,4',4"-Tris(carbazol-9-yl)-triphenylamine (TCTA), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane (DP $SiO_3$), octaphenylcyclotetra siloxane ($DPSiO_4$), and the like, may be included as a host material.

In an embodiment, the light emitting layer EML may include, as a dopant material, a styryl derivative (for example, 1,4-bis[2-(3-N-ethylcarbazoryl)vinyl]benzene (BCzVB), 4-(di-p-tolylamino)-4'-[(di-p-tolylamino)styryl] stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and a derivative thereof (for example, 2,5,5,8,11-tetra-t-butylperylene (TBP)), pyrene and a derivative thereof (for example, 1,1-dipyrene, 1,4-dipyrenylbenzene, and 1,4-Bis(N,N-Diphenylamino)pyrene), and the like.

The light emitting layer EML may include, for example, a metal complex including iridium (Ir), platinum (Pt), osmium (Os), gold (Au), titanium (Ti), zirconium (Zr), hafnium (Hf), europium (Eu), terbium (Tb), or thulium (Tm), as a phosphorescent dopant material. Specifically, iridium(III) bis(4,6-difluorophenylpyridinato-N,C2')picolinate (FIrpic), Bis(2,4-difluorophenylpyridinato)-tetrakis(1-pyrazolyl)borate iridium(III) (Fir6), or platinum octaethyl porphyrin (PtOEP) may be used as a phosphorescent dopant. However, the embodiment is not limited thereto.

The light emitting layers EML-R, EML-G, and EML-B of the light emitting elements ED-R, ED-G, and ED-B illustrated in FIG. 5 may include different light emitting materials. For example, the light emitting layers EML-R, EML-G, and EML-B may include different dopant materials.

Referring to FIG. 7B, the light receiving element OPD includes the light receiving layer OPL disposed on the hole transport region HTR. The light receiving layer OPL may include a light receiving material which receives light and convert the light to an electrical signal, and a p-dopant compound.

In an embodiment, the light receiving layer OPL may include the p-dopant layer p-DL and the active layer AL. The p-dopant layer p-DL may be disposed adjacent to the hole transport region HTR in the light receiving layer OPL. The p-dopant layer p-DL may include a p-dopant compound. The active layer AL may be disposed on the p-dopant layer p-DL in the light receiving layer OPL. The active layer AL may include a light receiving material. For example, the active layer AL may include a donor compound and an acceptor compound.

The light receiving element OPD according to an embodiment includes the p-dopant layer p-DL in the light receiving layer OPL to facilitate the movement of holes formed in the light receiving layer OPL, and thus, may exhibit increased photoelectric efficiency for converting received light to an electrical signal.

In an embodiment, the p-dopant layer p-DL is included in the light receiving element OPD, but may not be included in the light emitting elements ED-R, ED-G, and ED-B. In an embodiment, the p-dopant layer p-DL may not overlap the light emitting layers EML-R, EML-G, and EML-B. In case that there is a layer including a p-dopant compound inside the light emitting layers EML-R, EML-G, and EML-B, or a layer including a p-dopant compound adjacent to upper or lower portions of the light emitting layers EML-R, EML-G, and EML-B, quenching occurs, which may degrade light emitting efficiency.

The p-dopant layer p-DL is disposed below the active layer AL, and includes a p-dopant compound. The p-dopant layer p-DL may be disposed more adjacent to the hole transport region HTR than the active layer AL.

In an embodiment, the p-dopant layer p-DL may include a p-dopant compound. The p-dopant layer p-DL may have a single-layered structure having a single layer formed of a single p-dopant compound, or a single-layered structure having a single layer formed of different p-dopant compounds. Although not illustrated, the p-dopant layer p-DL may have a multi-layered structure having layers formed of different p-dopant compounds.

In an embodiment, the p-dopant layer p-DL may include a p-dopant compound and a donor compound. For example, the p-dopant layer p-DL may have a single-layered structure formed by co-depositing a p-dopant compound and a donor compound. The donor compound included in the p-dopant layer p-DL may be the same as the donor compound included in the active layer AL. In this case, since the p-dopant layer p-DL and the active layer AL may be formed in a same deposition chamber, the process may be simplified.

The p-dopant compound included in the p-dopant layer p-DL may include a metal having a work function of about 5.0 eV or greater. As another example, the p-dopant compound may include an organic compound having a HOMO level of about −5.0 eV or less. For example, the p-dopant layer p-DL may include a metal having a work function of about 5.0 eV or greater, a metal compound including a metal having a work function of about 5.0 eV or greater, an organic compound having a HOMO level of about −5.0 eV or less, or an organic/inorganic composite compound of an organic material and an inorganic material having a HOMO level of about −3.0 eV or less.

In an embodiment, the p-dopant compound may include at least one of a halogenated metal compound, a quinone derivative, a metal oxide, or a cyano group-containing compound, but the embodiment of the disclosure is not limited thereto. For example, the p-dopant compound may be a halogenated metal compound such as CuI and RbI, a quinone derivative such as tetracyanoquinodimethane (TCNQ) and 2,3,5,6-tetrafluoro-7,7',8,8'-tetracyanoquinodimethane (F4-TCNQ), a metal oxide such as a tungsten oxide and a molybdenum oxide, a cyano group-containing compound such as dipyrazino[2,3-f: 2',3'-h] quinoxaline-2,3,6,7,10,11-hexacarbonitrile (HATCN) and 4-[[2,3-bis[cyano-(4-cyano-2,3,5,6-tetrafluorophenyl)methylidene] cyclopropylidene]-cyanomethyl]-2,3,5,6-tetrafluorobenzonitrile (NDP9), and the like, but the embodiment of the disclosure is not limited thereto.

In an electronic device ED of an embodiment, the light receiving element OPD includes the light receiving layer OPL including the p-dopant layer p-DL, and the p-dopant layer p-DL includes a p-dopant including a metal having a work function of about 5.0 eV or greater, or an organic compound having a HOMO level of about −5.0 eV or less, and thus, may allow holes, generated in the light receiving layer OPL, to be easily transferred to the side of the hole transport region HTR. Accordingly, the light receiving element OPD in an embodiment may exhibit excellent photoelectric efficiency.

In an embodiment, the active layer AL may include a donor compound and an acceptor compound. For example, in an embodiment, the active layer AL may include, as an acceptor compound, a fullerene derivative, a perylene tetracarboxylic diimide (PTCDI) derivative, a perylene tetracarboxylic dianhydride (PTCDA) derivative, or the like.

In an embodiment, the active layer AL may include, as a donor compound, a phthalocyanine compound, a perylene-based compound, a squaraine dye compound, or the like. For example, in an embodiment, the light receiving layer OPL may include, as a donor compound, subphthalocyanine (SubPc), zinc phthalocyanine (ZnPc), ditolyaminothienyl-benzothiadiazole-dicyanovinylene (DTDCTB), lead phthalocyanine (PbPc), 5,10,15,20-Tetraphenyl bisbenz[5,6]indeno[1,2,3-cd: 1',2',3'-lm]perylene (DBP), copper phthalocyanine (CuPc), or the like.

In addition, in the light receiving element OPD according to an embodiment, the active layer AL may include an organic polymer material as a light receiving material, and for example, the active layer AL may include a conjugated polymer. The light receiving layer OPL may include a thiophene-based conjugated polymer, a benzodithiophene-based conjugated polymer, a thieno[3,4-c]pyrrole-4,6-dione (TPD)-based conjugated polymer, a diketo-pyrrole-pyrrole (DPP)-based conjugated polymer, a benzothiadiazole (BT)-based conjugated polymer, and the like. However, the embodiment of the disclosure is not limited thereto.

The active layer AL may be formed as a single layer including a donor compound and an acceptor compound. For example, the active layer AL may have a single-layered structure formed by co-depositing a donor compound and an acceptor compound. However, the embodiment of the disclosure is not limited thereto, and the active layer AL may be formed as layers.

Referring to FIG. 7C, active layers AL1 and AL2 may include at least one stacked first layer AL1 and second layer AL2 including a donor compound and an acceptor compound. In an embodiment, the first layer AL1 may include a donor compound, and the second layer AL2 may include an acceptor compound.

Referring to FIG. 7D, active layers AL1, AL2 and AL3 may include the first layer AL1, the second layer AL2, and a third layer AL3 including a donor compound and an acceptor compound. In an embodiment, the first layer AL1 may include a donor compound, the second layer AL2 may include a donor compound and an acceptor compound, and the third layer AL3 may include an acceptor compound. The second layer AL2 may be formed by co-depositing a donor compound and an acceptor compound. The second layer AL2 and the first layer AL1 may include a same donor compound or different donor compounds. The second layer AL2 and the third layer AL3 may include a same acceptor compound or different acceptor compounds.

Referring to FIGS. 7A to 7D, the electron transport region ETR forming the light emitting element ED-D and the light receiving element OPD may have a single-layered structure having a single layer formed of a single material, a single-layered structure having a single layer formed of different materials, or a multi-layered structure having layers formed of different materials.

The electron transport region ETR may include the electron transport layer ETL and the electron injection layer EIL. However, the embodiment of the disclosure is not limited thereto. The electron transport region ETR may have a single-layered structure. In addition, the electron transport region ETR may further include a hole blocking layer (now shown) and the like.

In the light emitting element ED-D, the electron transport region ETR is disposed on the light emitting layer EML, and the electron transport region ETR may be disposed on the light receiving layer OPL in the light receiving element OPD.

In an embodiment, the electron transport layer ETL may include an anthracene-based compound. However, the embodiment of the disclosure is not limited thereto. The electron transport layer ETL may include tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, tri(-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1, O8)-(1,1'-biphenyl-4-olato)aluminum (BAlq), berylliumbis(benzoquinolin-10-olate) ($Bebq_2$), 9,10-di(naphthalene-2-yl)anthracene (ADN), 1,3-bis[3,5-di(pyridin-3-yl)phenyl]benzene (BmPyPhB), and a compound thereof.

In an embodiment, the electron injection layer EIL may include a halogenated metal such as LiF, NaCl, CsF, RbCl, RbI, CuI, and KI, a lanthanum group metal such as Yb, or a co-deposition material of the above halogenated metal and the lanthanum group metal. For example, the electron injection layer EIL may include KI:Yb, RbI:Yb, and the like as the co-deposition material. As the electron injection layer EIL, a metal oxide such as $Li_2O$ and BaO, or LiQ and the like may be used, but the embodiment of the disclosure is not limited thereto. The electron injection layer EIL may also be composed of a mixture of an electron transport material and an insulating organometallic salt. The organometallic salt may be a material having an energy band gap of about 4 eV or greater. Specifically, for example, the organometallic salt may include metal acetate, metal benzoate, metal acetoacetate, metal acetylacetonate, or metal stearate.

Figure 8A:
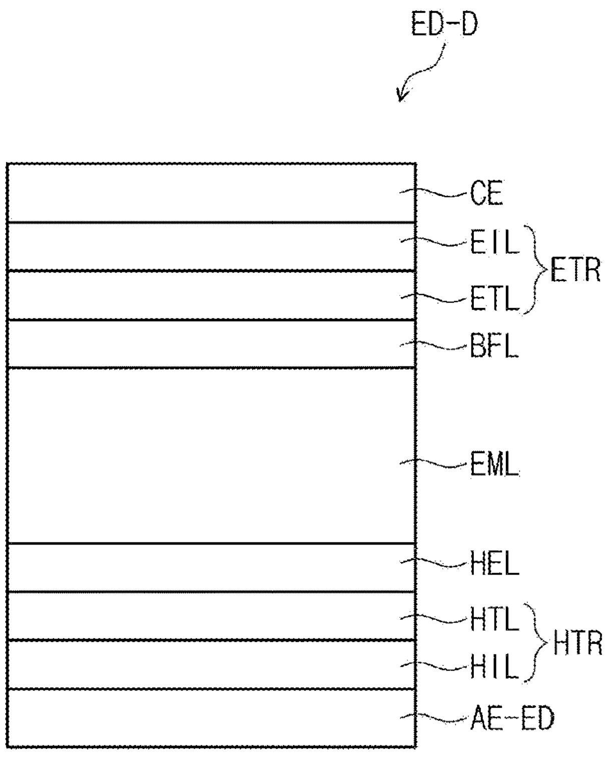
FIG. 8A is a schematic cross-sectional view showing a light emitting element according to an embodiment of the disclosure.
Figure 8B:
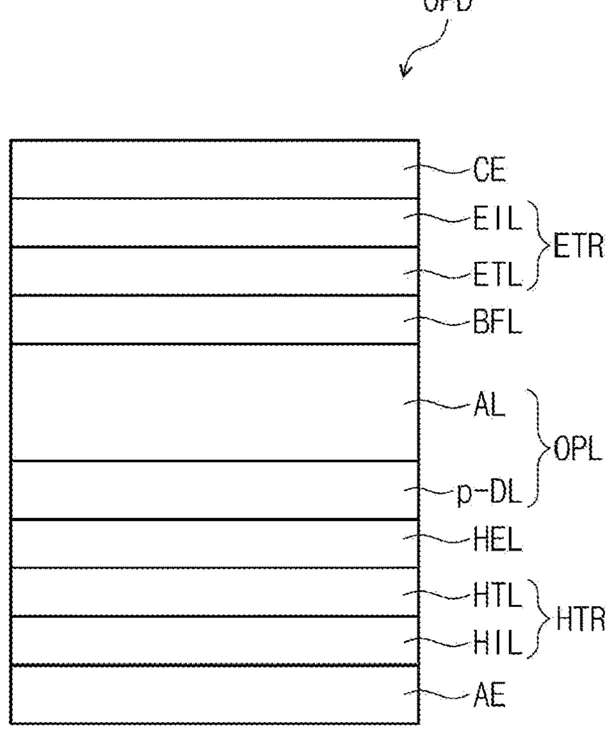
FIG. 8B is a schematic cross-sectional view showing a light receiving element according to an embodiment of the disclosure.

FIGS. 8A and 8B are respectively views illustrating cross-sections of a light emitting element and a light receiving element. FIG. 8A is a schematic cross-sectional view illustrating a light emitting element according to an embodiment of the disclosure, and FIG. 8B is a schematic cross-sectional view illustrating a light receiving element according to an embodiment of the disclosure. The light emitting element ED-D according to an embodiment illustrated in FIG. 8A differs from a light emitting element illustrated in FIG. 7A in that the light emitting element ED-D further includes an auxiliary layer HEL and a buffer layer BFL. In addition, the light receiving element OPD illustrated in 8B differs from a light receiving element illustrated in FIG. 7B in that the light receiving element OPD further includes an auxiliary layer HEL and a buffer layer BFL. The light emitting element ED-D illustrated in FIG. 8A and the light receiving element OPD illustrated in FIG. 8B may correspond to an embodiment of the light emitting elements ED-R, ED-G, and ED-B of the display element layer EDL in the display module DM and the light receiving element OPD illustrated in FIG. 5.

Referring to FIG. 8A, the light emitting element ED-D according to an embodiment may have a structure in which the first electrode AE-ED, the hole transport region HTR, the auxiliary layer HEL, the light emitting layer EML, the buffer layer BFL, the electron transport region ETR, and the second electrode CE are stacked. Referring to FIG. 8B, the light receiving element OPD according to an embodiment may have a structure in which the first electrode AE, the hole transport region HTR, the auxiliary layer HEL, the light receiving layer OPL, the buffer layer BFL, the electron transport region ETR, and the second electrode CE are stacked.

The auxiliary layer HEL may include a material used in the hole transport region HTR. For example, the auxiliary layer HEL may include a carbazole-based derivative such as N-phenylcarbazole and polyvinylcarbazole, a fluorene-based derivative, a triphenylamine-based derivative such as N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N'-di(naphthalene-1-yl)-N,N'-diplienyl-benzidine (NPB), 4,4'-Cyclohexylidene bis[N,N-bis(4-methylphenyl)benzenamine] (TAPC), 4,4'-Bis[N,N'-(3-tolyl)amino]-3,3'-dimethylbiphenyl (HMTPD), 9-(4-tert-Butylphenyl)-3,6-bis(triphenylsilyl)-9H-carbazole (CzSi), 9-phenyl-9H-3,9'-bicarbazole) (CCP), 1,3-Bis(N-carbazolyl)benzene (mCP), 1,3-bis(1,8-dimethyl-9H-carbazol-9-yl)benzene (mDCP), or the like.

In the light emitting element ED-D, the auxiliary layer HEL may be used as a light emitting auxiliary layer. For example, in the light emitting element ED-D, the auxiliary layer HEL may increase light emission efficiency by compensating for a resonance distance according to the wavelength of light emitted from the light emitting layer EML. In an embodiment, according to the wavelength of light emitted from the light emitting layers EML-R, EML-G, and EML-B of the light emitting elements ED-R, ED-G, and ED-B illustrated FIG. 5, the auxiliary layer HEL may be provided by being adjusted to have different thicknesses.

In the light receiving element OPD, the auxiliary layer HEL may be used as an electron blocking layer. For example, the auxiliary layer HEL may prevent electrons formed in the light receiving layer OPL from being transferred to the hole transport region HTR, or reduce the transfer of the electrons.

The buffer layer BFL may be used as a hole blocking layer. For example, the buffer layer BFL may prevent holes, formed in the light receiving layer OPL, from being transferred to the electron transport region ETR, or reduce the transfer of the electrons. Although not illustrated, the buffer layer BFL may be provided as a common layer. For example, in an embodiment, the buffer layer BFL may be provided as a common layer to all of the light emitting element ED-G and the light receiving element OPD. The buffer layer BFL may overlap all of the light emitting regions PXA-R, PXA-G, and PXA-B, the light receiving region IPA, and the non-light emitting region NPXA.

The buffer layer BFL may include at least one of 2,9-dimethyl-4,7-diphenyl-1,10-phenanthroline (BCP) and 4,7-diphenyl-1,10-phenanthroline (Bphen). However, the embodiment of the disclosure is not limited thereto.

Referring back to FIG. 5, the light emitting layers EML-R, EML-G, and EML-B of the light emitting elements ED-R, ED-G, and ED-B may each be separated from each other and formed in the first opening OP-E. In addition, the light receiving layer OPL of the light receiving element OPD may be separated into portions and formed in the second opening OP-I.

In an embodiment illustrated in FIG. 5, the electron transport region ETR is disposed on each of the light emitting layers EML-R, EML-G, and EML-B of the light emitting elements ED-R, ED-G, and ED-B, or on the light receiving layer OPL of the light receiving element OPD, and may be provided by being divided by the pixel definition film PDL. In addition, in an embodiment, the electron transport region ETR may be provided as a common layer. The electron transport region ETR may be provided as a common layer to all of the light emitting elements ED-R, ED-G, and ED-B and the light receiving element OPD. The electron transport region ETR may overlap all of the light emitting regions PXA-R, PXA-G, and PXA-B, the light receiving region IPA, and the non-light emitting region NPXA.

An embodiment may include the encapsulation layer TFL disposed on the light emitting elements ED-R, ED-G, and ED-B and the light receiving element OPD. The encapsulation layer TFL may include at least one inorganic layer and at least one organic layer. For example, the encapsulation layer TFL may include an inorganic layer, an organic layer, and an inorganic layer sequentially stacked, but layers constituting the encapsulation layer TFL are not limited thereto.

The display module DM according to an embodiment may include the input sensing layer ISL disposed on the display panel DP. The input sensing layer ISL may be disposed on the display element layer EDL. The input sensing layer ISL may sense an external input applied from the outside. The external input may be a user input. The user input includes various forms of external inputs such as a part of a user's body, light, heat, a pen, and pressure.

The input sensing layer ISL may be formed on the display panel DP by a continuous process. In this case, the input sensing layer ISL may be described as being directly disposed on the display panel DP. Being directly disposed may mean that a third element is not disposed between the input sensing layer ISL and the display panel DP. For example, a separate adhesive member may not be disposed between the input sensing layer ISL and the display panel DP. For example, the input sensing layer ISL may be directly disposed on the encapsulation layer TFL.

The embodiment of the disclosure is not limited thereto. An adhesive member (not shown) may be further disposed between the input sensing layer ISL and the display panel DP. The input sensing layer ISL may include a lower insulation layer IS-IL1, a first conductive layer IS-CL1, an interlayer insulation layer IS-IL2, a second conductive layer IS-CL2, and an upper insulation layer IS-IL3. In an embodiment of the disclosure, at least one of the lower insulation layer IS-IL1 and the upper insulation layer IS-IL3 may be omitted.

Each of the first conductive layer IS-CL1 and the second conductive layer IS-CL2 may have a single-layered structure, or may have a multi-layered structure in which they are stacked in the third axis direction DR3. A conductive layer of a multi-layered structure may include at least two layers of transparent conductive layers and metal layers. A conductive layer of a multi-layered structure may include metal layers including different metals. The transparent conductive layer may include indium tin oxide (ITO), indium zinc oxide (IZO), zinc oxide (ZnO), indium tin zinc oxide (ITZO), PEDOT, metal nanowires, and graphene. The metal layer may include molybdenum, silver, titanium, copper, aluminum, or an alloy thereof. For example, each of the first conductive layer IS-CL1 and the second conductive layer IS-CL2 may have a three-layered metal layer structure, such as a three-layered structure of titanium/aluminum/titanium. A metal having relatively high durability and low reflectance may be applied to upper/lower layers, and a metal having high electrical conductivity may be applied to an inner layer.

Each of the first conductive layer IS-CL1 and the second conductive layer IS-CL2 includes conductive patterns. Hereinafter, the first conductive layer IS-CL1 is described as including first conductive patterns, and the second conductive layer IS-CL2 is described as including second conductive patterns. Each of the first conductive patterns and the second conductive patterns may include sensing electrodes and signal lines connected thereto. The first conductive patterns and the second conductive patterns may be disposed overlapping a light blocking portion BM to be described later. The light blocking portion BM overlaps the first conductive layer IS-CL1 and the second conductive layer IS-CL2 to prevent external light reflection by the first conductive layer IS-CL1 and the second conductive layer IS-CL2.

The lower insulation layer IS-IL1, the interlayer insulation layer IS-IL2, and the upper insulation layer IS-IL3 may each include an inorganic film or an organic film. In the embodiment, the lower insulation layer IS-IL1 and the interlayer insulation layer IS-IL2 may each be an inorganic film. In addition, the upper insulation layer IS-IL3 may include an organic film.

In an embodiment, the display module DM may include the reflection prevention member RP disposed on the display panel DP. In an embodiment, the reflection prevention member RP may be directly disposed on the input sensing layer ISL. The reflection prevention member RP may include the color filter layer CFL and the organic planarization layer OCL.

The color filter layer CFL may include filters CF and the light blocking portion BM. The filters CF may include a red filter CF-R, a green filter CF-G, and a blue filter CF-B. The red filter CF-R, the green filter CF-G, and the blue filter CF-B may be portions positioned respectively corresponding to the red light emitting region PXA-R, the green light emitting region PXA-G, and the blue light emitting region PXA-B. In addition, the green filter CF-G may overlap the light receiving region IPA. For example, in an embodiment, the green filter CF-G may overlap the green light emitting element ED-G and the light receiving element OPD.

The red filter CF-R may transmit red light, the green filter CF-G may transmit green light, and blue filter CF-B may transmit blue light. The red filter CF-R, the green filter CF-G, and the blue filter CF-B may each include a polymer photosensitive resin, and a pigment or a dye. The red filter CF-R may include a red pigment or a red dye, the green filter CF-G may include a green pigment or a green dye, and the blue filter CF-B may include a blue pigment or a blue dye.

The embodiment of the disclosure is not limited thereto, and the blue filter CF-B may not include a pigment or a dye. The blue filter CF-B may include a polymer photosensitive resin, and may not include a pigment or a dye. The blue filter CF-B may be transparent. The blue filter CF-B may be formed of a transparent photosensitive resin.

The light blocking portion BM may be disposed on the input sensing layer ISL, and may overlap boundaries of neighboring filters CF. Edges of neighboring filter CF may overlap each other. For example, the green filter CF-G and the red filter CF-R may be disposed on the light blocking portion BM to overlap each other, or the green filter CF-G and the blue filter CF-B may be disposed on the light blocking portion BM to overlap each other. The light blocking portion BM may prevent a light leakage phenomenon, and may divide boundaries between the color filters CF-R, CF-G, and CF-B.

The light blocking portion BM may be a black matrix. The light blocking portion BM may include an organic pigment or dye. The light blocking part BM may be formed by including an organic light blocking material or an inorganic light blocking material which includes a black pigment or a black dye. In addition, the light blocking portion BM may overlap the pixel definition film PDL. The light blocking layer BML may overlap the pixel definition film PDL which divides between the light emitting regions PXA-R, PXA-G, and PXA-B, and between the light emitting regions PXA-R, PXA-G, and PXA-B and the light receiving region IPA.

The organic planarization layer OCL may be disposed on the color filter layer CFL. The organic planarization layer OCL may be disposed on the color filter layer CFL to protect the color filters CF-R, CF-G, and CF-B and planarize an upper surface of the color filter layer CFL. The organic planarization layer OCL may include an organic material such as an acrylic resin, an epoxy resin, or the like.

An electronic device of an embodiment includes a light emitting element and a light receiving element in a display element layer, and includes a p-dopant compound in a light receiving layer disposed on a hole transport region of the light receiving element and not overlapping a light emitting layer of the light emitting element, and thus, may exhibit improved efficiency of the light receiving element. For example, an electronic device of an embodiment includes, in an p-dopant layer of a light receiving layer, a p-dopant material including a metal having a work function of about 5.0 eV or greater, or an organic compound having a HOMO level of about −5.0 eV or less, and thus, may facilitate the extraction of holes in a light receiving layer.

Figure 9:
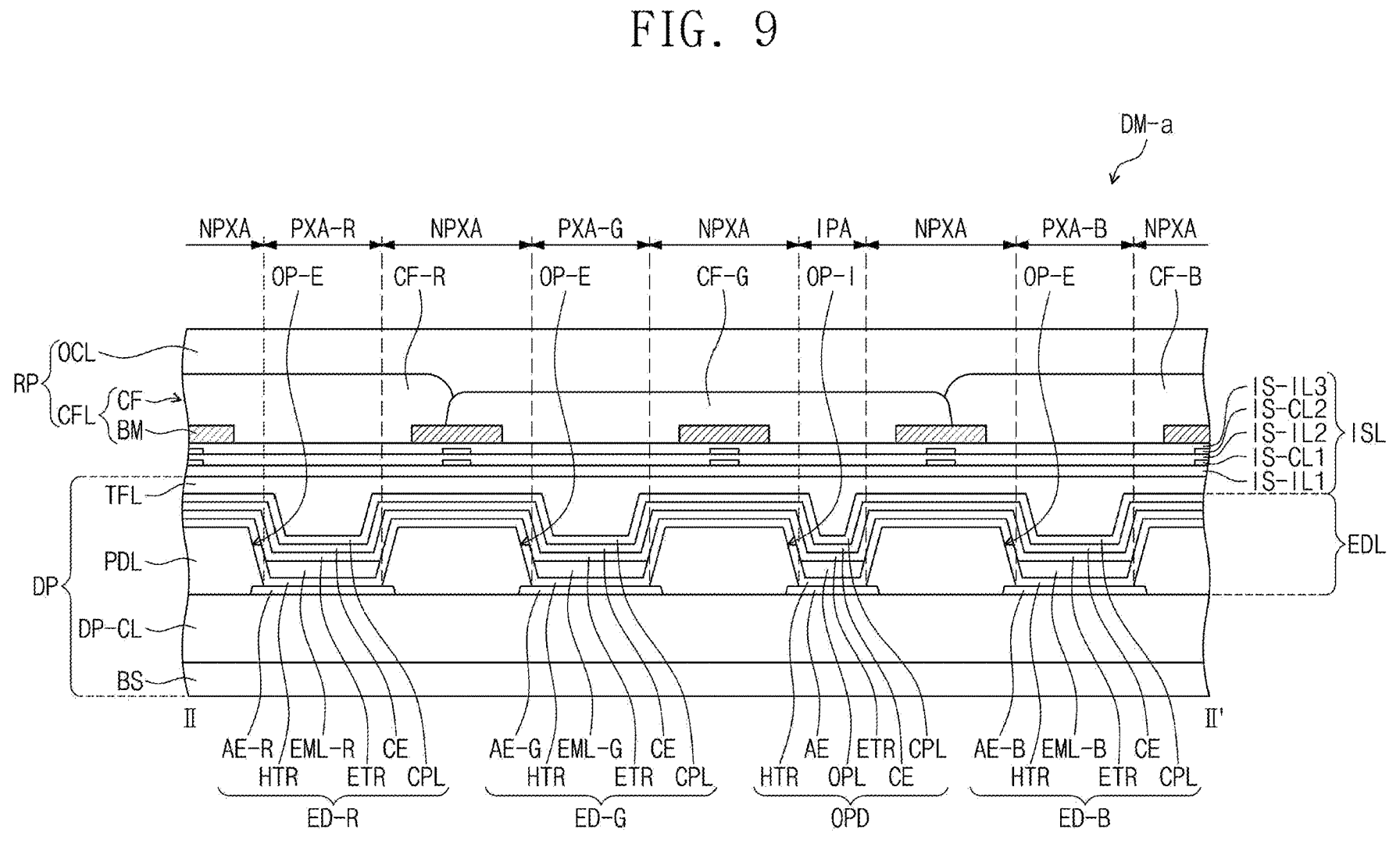

FIG. 9 is a schematic view illustrating a cross-section of a display module according to an embodiment of the disclosure. In the description of an embodiment described with reference to FIG. 9, contents the same as those described above with reference to FIGS. 1 to 8B and the like will not be described again. Instead, differences will be described.

A display module DM-a according to an embodiment illustrated in FIG. 9 partially differs from the display module DM according to an embodiment illustrated and described in FIG. 5 in the configuration of the light emitting elements ED-R, ED-G, and ED-B and the light receiving element OPD.

Referring to FIG. 9, compared to an embodiment illustrated in FIG. 5, there is a difference in that the hole transport region HTR is disposed as a common layer in all of the light emitting elements ED-R, ED-G, and ED-B and the light receiving element OPD. The hole transport region HTR may overlap all of the light emitting regions PXA-R, PXA-G, and PXA-B, the light receiving region IPA, and the non-light emitting region NPXA without being patterned.

In addition, in an embodiment illustrated in FIG. 9, the display element layer EDL may further include a capping layer CPL. The capping layer CPL may be disposed on the second electrode CE of the light emitting elements ED-R, ED-G, and ED-B and the light receiving element OPD. The capping layer CPL may be disposed between the second electrode CE and the encapsulation layer TFL. The capping layer CPL may be provided as a common layer overlapping all of the pixel definition film PDL, the light emitting layers EML-R, EML-G, and EML-B, and the light receiving layer OPL.

The capping layer CPL may include multilayers or a single layer. In an embodiment, the capping layer CPL may be an organic layer or an inorganic layer. For example, in case that the capping layer CPL includes an inorganic substance, the inorganic substance may include an alkaline metal compound such as LiF, an alkaline earth metal compound such as $MgF_2$, SiON, $SiN_x$, $SiO_y$, or the like.

For example, in case that the capping layer CPL includes an organic substance, the organic substance may include α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-Tris (carbazol yl) triphenylamine (TCTA), and the like, or may include an epoxy resin, or an acrylate such as a methacrylate. However, the embodiment of the disclosure is not limited thereto.

The refractive index of the capping layer CPL may be about 1.6 or greater. Specifically, for light in a wavelength region of about 550 nm to about 660 nm, the refractive index of the capping layer CPL may be about 1.6 or greater.

Figure 10A:
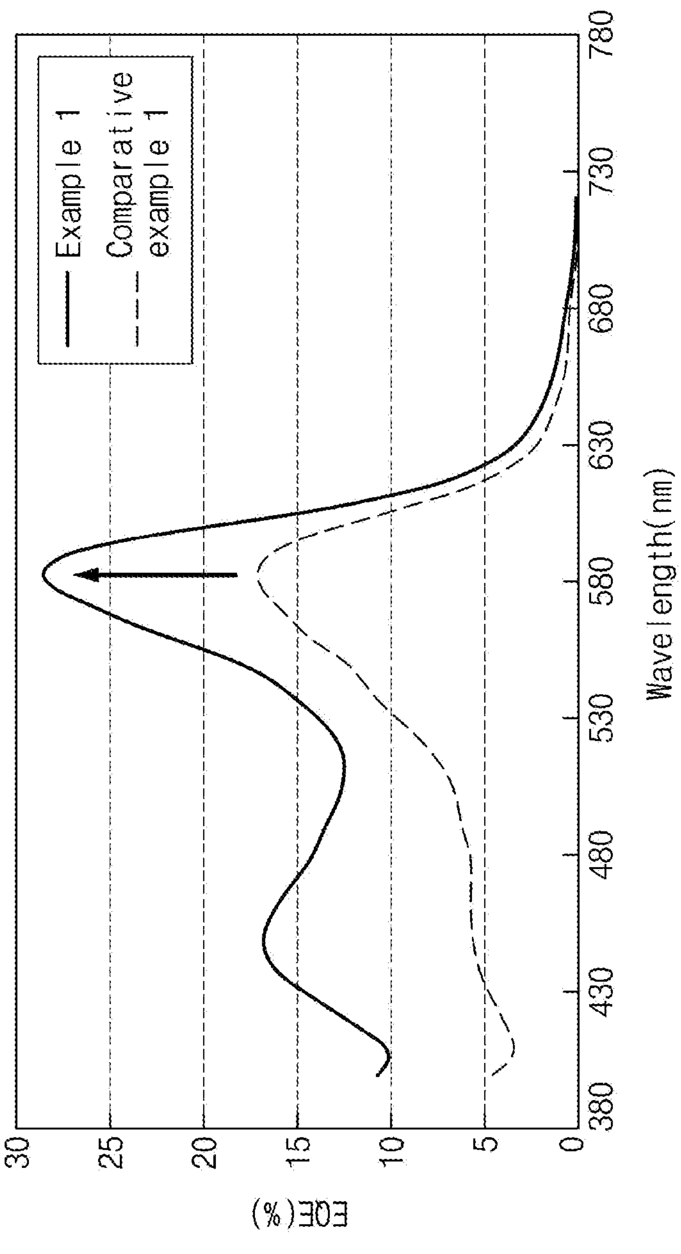
FIG. 10A and FIG. 10B are schematic graphs illustrating the light receiving efficiency of Examples and Comparative Examples.
Figure 10B:
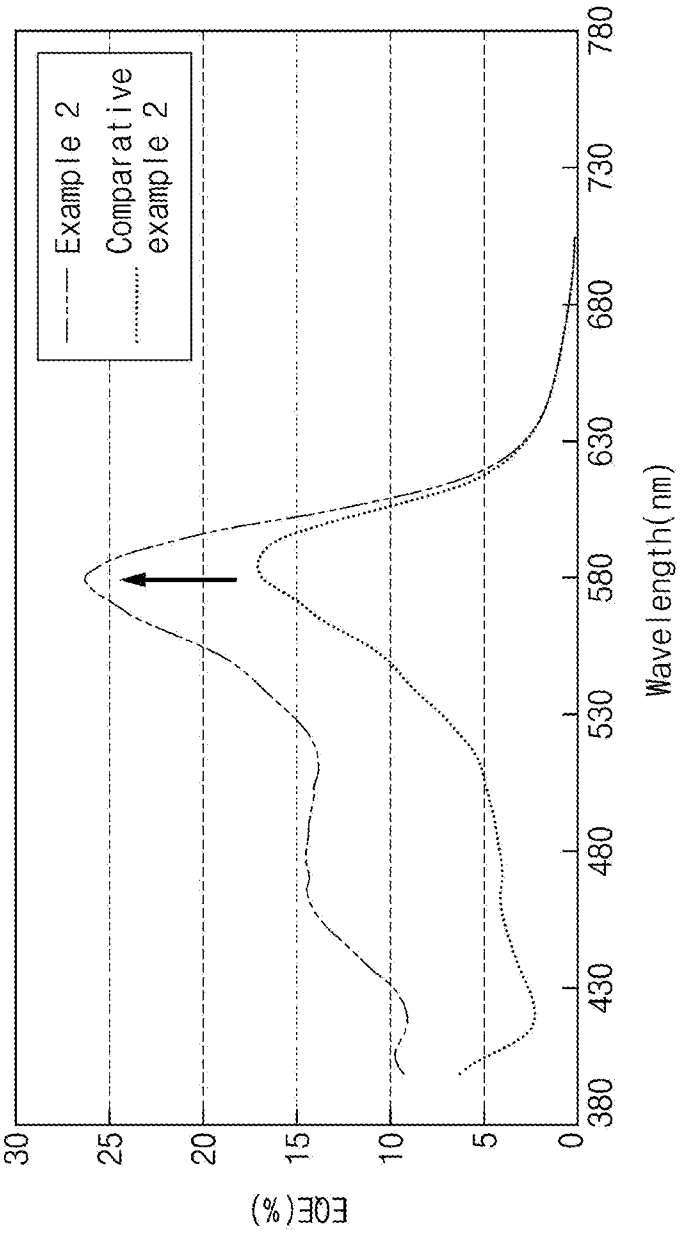

FIGS. 10A and 10B are schematic graphs illustrating the measurement of the light receiving efficiency with respect to light receiving elements of Examples and Comparative Examples. The efficiency EQE (%) of a light receiving element is relative efficiency based on 100% in case that the efficiency is all converted to photoelectric conversion efficiency.

Referring to FIGS. 10A and 10B, a light receiving element according to an embodiment of the disclosure will be described in detail. In addition, Examples shown below are for illustrative purposes only to facilitate the understanding of the disclosure, and thus, the scope of the disclosure is not limited thereto.

A light receiving element (Example 1) of Example 1 of FIG. 10A was manufactured as being a light receiving element including a single p-dopant layer having a p-dopant compound and a donor compound and an active layer having a donor compound and an acceptor compound.

Specifically, a hole injection layer was formed by cleaning a glass substrate patterned with ITO, and co-depositing N,N'-di(naphthalene-1-yl)-N,N'-diphenyl-benzidine (NPB) and 4-[[2,3-bis[cyano-(4-cyano-2,3,5,6-tetrafluorophenyl) methylidene]cyclopropylidene]-cyanomethyl]-2,3,5,6-tetrafluorobenzonitrile (NDP9). Next, NPB was deposited to form a hole transport layer. Thereafter, NDP9 as a p-dopant compound and subphthalocyanine (SubPc) as a donor compound were co-deposited to form a p-dopant layer. On the p-dopant layer, SubPc as a donor compound and Fullerene C60 as an acceptor compound were co-deposited to form an active layer. On the active layer, tris(8-hydroxyquinolino) aluminum ($Alq_3$) was deposited to form a buffer layer, $Alq_3$ and Liq were co-deposited to form an electron transport layer, and Yb was deposited to form an electron injection layer. Thereafter, AgMg was deposited to form a second electrode. Next, NPB was deposited to form a capping layer.

A light receiving element (Comparative Example 1) of Comparative Example 1 of FIG. 10A was manufactured in the same configuration as that of Example 1, except that a p-dopant layer was not included in Example 1.

A light receiving element (Example 2) of Example 2 of FIG. 10B was manufactured as being a light receiving element including a p-dopant layer having only the p-dopant compound, a first light receiving layer having a donor compound, and a second light receiving layer having an acceptor compound. Specifically, NDP9 was deposited to form a p-dopant layer, and SubPc was deposited on the p-dopant layer to form a first light receiving layer. The light receiving element (Example 2) of Example 2 was manufactured in the same configuration as that of Example 1, except that Fullerene C60 was deposited on the first light receiving layer to form a second light receiving layer in Example 1.

A light receiving element (Comparative Example 2) of Comparative Example 2 of FIG. 10B was manufactured in the same configuration as that of Example 2, except that a p-dopant layer was not included in Example 2.

Referring to FIG. 10A and FIG. 10B, it has been confirmed that Examples which include a p-dopant layer having a p-dopant compound between a hole transport layer and an active layer have excellent light receiving element efficiency compared to Comparative Examples which do not include a p-dopant layer.

An embodiment of the disclosure may provide an electronic device having improved photoelectric efficiency by including an electron extracting layer inside a light receiving layer of a light receiving element to facilitate the movement of holes generated in the light receiving layer.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A light receiving element comprising:
- a first electrode;
- a hole transport region disposed on the first electrode;
- a light receiving layer disposed on the hole transport region and converting incident light to an electrical signal;
- an electron transport region disposed on the light receiving layer; and
- a second electrode disposed on the electron transport region, wherein
- the light receiving layer includes a p-dopant compound, a donor compound, and an acceptor compound,
- the donor compound comprises one or more of a phthalocyanine compound, a perylene-based compound, or a squaraine dye compound, and
- the light receiving layer comprises:
  - a p-dopant layer including a single layer comprising the p-dopant compound and the donor compound; and
  - an active layer including the donor compound and the acceptor compound.

2. The light receiving element of claim 1, wherein the p-dopant layer is disposed more adjacent to the hole transport region than the active layer.

3. The light receiving element of claim 1, wherein the active layer is a single layer comprising the donor compound and the acceptor compound.

4. The light receiving element of claim 1, wherein the active layer comprises:
- a first layer disposed on the p-dopant layer and including the donor compound; and a second layer disposed on the first layer and including the acceptor compound.

5. The light receiving element of claim 1, wherein the active layer comprises:

a first layer disposed on the p-dopant layer and including the donor compound;

a second layer disposed on the first layer and including the donor compound and the acceptor compound; and a third layer disposed on the second layer and including the acceptor compound.

6. The light receiving element of claim 1, wherein the p-dopant compound comprises:

a metal having a work function of about 5.0 eV or greater, or an organic compound having a HOMO level of about −5.0 eV or less.

7. The light receiving element of claim 6, wherein the p-dopant compound comprises at least one of a halogenated metal compound, a quinone derivative, a metal oxide, and a cyano group-containing compound.

8. The light receiving element of claim 1, wherein the acceptor compound comprises a fullerene derivative or a perylene tetracarboxylic diimide (PTCDI) derivative.

9. The light receiving element of claim 1, wherein the donor compound comprises a phthalocyanine-based compound or a perylene-based compound.

10. The light receiving element of claim 1, further comprising:

a capping layer disposed on the second electrode, wherein the refractive index of the capping layer is about 1.6 or greater.

11. The light receiving element of claim 1, further comprising:

a buffer layer disposed between the light receiving layer and the electron transport region.

12. An electronic device comprising:

a base layer; and a display element layer disposed on the base layer and including:

a pixel definition film having an opening; and a light emitting element and a light receiving element divided by the pixel definition film, wherein each of the light emitting element and the light receiving element includes:

a first electrode;

a hole transport region disposed on the first electrode;

an electron transport region disposed on the hole transport region; and a second electrode disposed on the electron transport region, the light emitting element includes a light emitting layer disposed between the hole transport region and the electron transport region, the light receiving element includes a light receiving layer disposed between the hole transport region and the electron transport region, the light receiving element converts incident light to an electrical signal, the light receiving layer includes a p-dopant compound, a donor compound, and an acceptor compound, the donor compound comprises one or more of a phthalocyanine compound, a perylene-based compound, or a squaraine dye compound, and the light receiving layer comprises:

a p-dopant layer including a single layer comprising the p-dopant compound and the donor compound; and an active layer including the donor compound and the acceptor compound.

13. The electronic device of claim 12, wherein the active layer is a single layer comprising the donor compound and the acceptor compound.

14. The electronic device of claim 12, wherein the active layer comprises:

a first layer disposed on the p-dopant layer and including the donor compound; and a second layer disposed on the first layer and including the acceptor compound.

15. The electronic device of claim 12, wherein the light emitting element does not comprise the p-dopant layer.

16. An electronic device comprising:

a display module divided into a red light emitting region, a green light emitting region, a blue light emitting region, and a light receiving region spaced apart from each other on a plane, wherein the display module includes:

a base layer;

a display element layer disposed on the base layer and including:

a light emitting element; and a light receiving element; and an input sensing layer disposed on the display element layer, the display element layer includes:

a first electrode;

a hole transport region disposed on the first electrode;

an electron transport region disposed on the hole transport region; and a second electrode disposed on the electron transport region, the light emitting element includes a light emitting layer disposed between the hole transport region and the electron transport region, and overlapping only the red light emitting region, the green light emitting region, and the blue light emitting region, the light receiving element includes a light receiving layer disposed between the hole transport region and the electron transport region, and overlapping only the light receiving region, the light receiving layer includes a p-dopant compound, a donor compound, and an acceptor compound, the donor compound comprises one or more of a phthalocyanine compound, a perylene-based compound, or a squaraine dye compound, and the light receiving layer comprises:

a p-dopant layer including a single layer comprising the p-dopant compound and the donor compound; and an active layer including the donor compound and the acceptor compound.

17. The electronic device of claim 16, wherein the light emitting element comprises:

a red light emitting element corresponding to the red light emitting region;

a blue light emitting element corresponding to the blue light emitting region; and a green light emitting element corresponding to the green light emitting region.

18. The electronic device of claim 12, wherein the electronic device is a mobile phone, a tablet computer, a car navigation system, a game console, or a wearable device.

19. The light receiving element of claim 1, wherein the single layer comprising the p-dopant compound and the donor compound directly contacts the active layer including the donor compound and the acceptor compound.

20. The light receiving element of claim 1, wherein the donor compound comprises one or more of subphthalocyanine (SubPc), zinc phthalocyanine (ZnPc), ditolyaminothienyl-benzothiadiazole-dicyanovinylene (DTDCTB), lead phthalocyanine (PbPc), 5,10,15,20-Tetraphenyl bisbenz[5,6] indeno [1,2,3-cd: 1',2',3'-lm]perylene (DBP), or copper phthalocyanine (CuPc).

21. The light receiving element of claim 1, wherein the p-dopant layer and the active layer include the same donor compound.

* * * * *